US010020320B2

(12) United States Patent
Nakaki et al.

(10) Patent No.: US 10,020,320 B2
(45) Date of Patent: Jul. 10, 2018

(54) SEMICONDUCTOR DEVICE AND METHOD FOR MANUFACTURING SAME

(71) Applicant: Toshiba Memory Corporation, Minato-ku (JP)

(72) Inventors: Hiroshi Nakaki, Yokkaichi (JP); Masaru Kito, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 5 days.

(21) Appl. No.: 15/263,739

(22) Filed: Sep. 13, 2016

(65) Prior Publication Data

US 2017/0243884 A1 Aug. 24, 2017

Related U.S. Application Data

(60) Provisional application No. 62/299,244, filed on Feb. 24, 2016.

(51) Int. Cl.
*H01L 27/00* (2006.01)
*H01L 27/11582* (2017.01)
*H01L 23/373* (2006.01)

(52) U.S. Cl.
CPC ...... *H01L 27/11582* (2013.01); *H01L 23/373* (2013.01)

(58) Field of Classification Search
CPC .................................................. H01L 27/11582
See application file for complete search history.

(56) References Cited

U.S. PATENT DOCUMENTS

2007/0252201 A1 11/2007 Kito et al.
2009/0267135 A1 10/2009 Tanaka et al.
2011/0147818 A1* 6/2011 Katsumata ........ H01L 27/11573 257/314
2011/0284947 A1 11/2011 Kito et al.
2011/0287597 A1 11/2011 Kito et al.
2012/0064682 A1 3/2012 Jang et al.
2012/0104484 A1 5/2012 Lee et al.
2015/0372006 A1 12/2015 Kito et al.
2016/0049421 A1* 2/2016 Zhang ............... H01L 27/11582 257/314

FOREIGN PATENT DOCUMENTS

JP 2007-266143 10/2007
JP 2009-267243 11/2009
JP 2011-40467 2/2011

* cited by examiner

*Primary Examiner* — William Harriston
(74) *Attorney, Agent, or Firm* — Oblon, McClelland, Maier & Neustadt, L.L.P.

(57) ABSTRACT

According to the embodiment, a semiconductor device includes: a stacked body; a columnar portion, an insulating portion; and wall portion. The stacked body includes a plurality of electrode layers stacked with an insulator interposed. The columnar portion is provided in the stacked body and extends in a staking direction of the stacked body. The insulating portion is provided around the stacked body and surrounds the stacked body. The wall portion is provided in the insulating portion and is separated from the stacked body. The wall portion extends in the stacking direction and in a first direction crossing the stacking direction.

19 Claims, 26 Drawing Sheets

X
Y
40
8B
CL
CL
60s
63 62 61
85
8B

Z
Y
100
40 41 40 41 40
41 40 41 40
10
50 20 30
CL
D2
85
63 62 61
60
60s
D1

16B
16B
X
Y
40
40
85
85

Z
Y
100
4
40
41
40
41
40
41
40
41
40
10
100
85
85
Tr

42s
BL
18B
90
V1
CL
BLK
60
X
Y
Z
Cb
42m
40
SGD
WL
SGS
10
100
91
30
20
50
SL
85
64
66

42m
25B
BLK
ST
CL
CL
BLK
ST
60
42m
25B
X
Y 100
42m
40
41
10
30
20
50
CL
ST
85
42m
60
Z
Y

SEMICONDUCTOR DEVICE AND METHOD FOR MANUFACTURING SAME

CROSS-REFERENCE TO RELATED APPLICATIONS

This application is based upon and claims the benefit of priority from U.S. Provisional Patent Application 62/299,244, filed on Feb. 24, 2016; the entire contents of which are incorporated herein by reference.

FIELD

Embodiments described herein relate generally to a semiconductor device and a method for manufacturing the same.

BACKGROUND

A memory device having a three-dimensional structure has been proposed in which a memory hole is made in a stacked body in which multiple electrode layers are stacked, and a charge storage film and a semiconductor film are provided to extend in a stacking direction of the stacked body inside the memory hole. The memory device includes multiple memory cells connected in series between a drain-side selection transistor and a source-side select transistor. When the memory device is formed, the stacked body may be affected by a stress from a peripheral structure.

DETAILED DESCRIPTION

Figure 1:
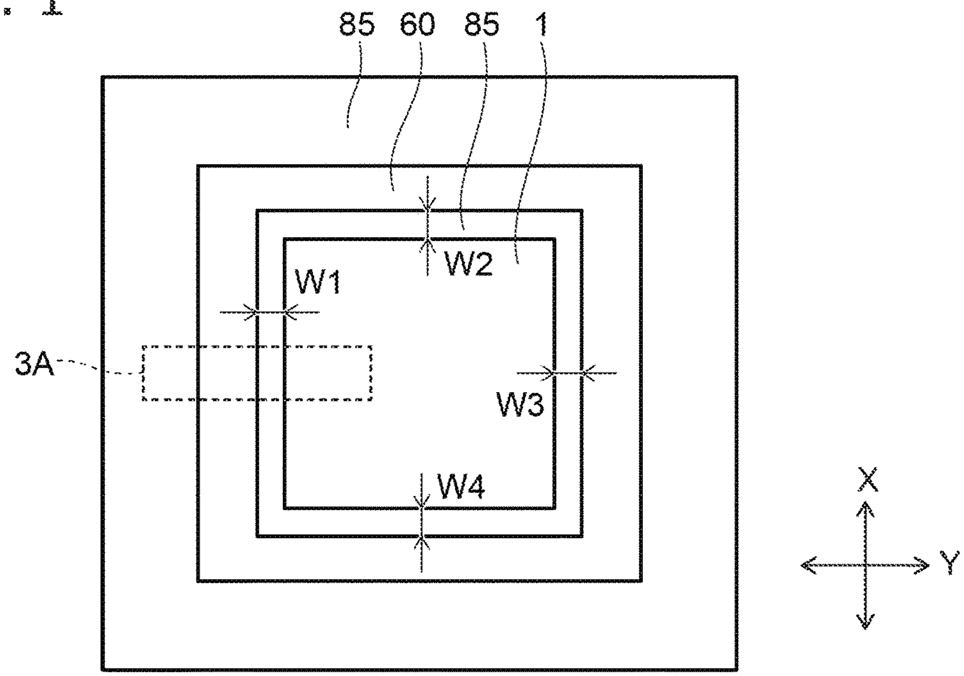
FIG. 1 is a schematic plane view showing a layout of the semiconductor device of a first embodiment.

According to the embodiment, a semiconductor device includes: a stacked body; a columnar portion, an insulating portion; and wall portion. The stacked body includes a plurality of electrode layers stacked with an insulator interposed. The columnar portion is provided in the stacked body and extends in a staking direction of the stacked body. The insulating portion is provided around the stacked body and surrounds the stacked body. The wall portion is provided in the insulating portion and is separated from the stacked body. The wall portion extends in the stacking direction and in a first direction crossing the stacking direction.

Embodiments will now be described with reference to the drawings. In the respective drawings, like members are labeled with like reference numerals. Semiconductor devices of the embodiments are semiconductor memory devices having memory cell arrays.

First Embodiment: Semiconductor Device

Figure 2:
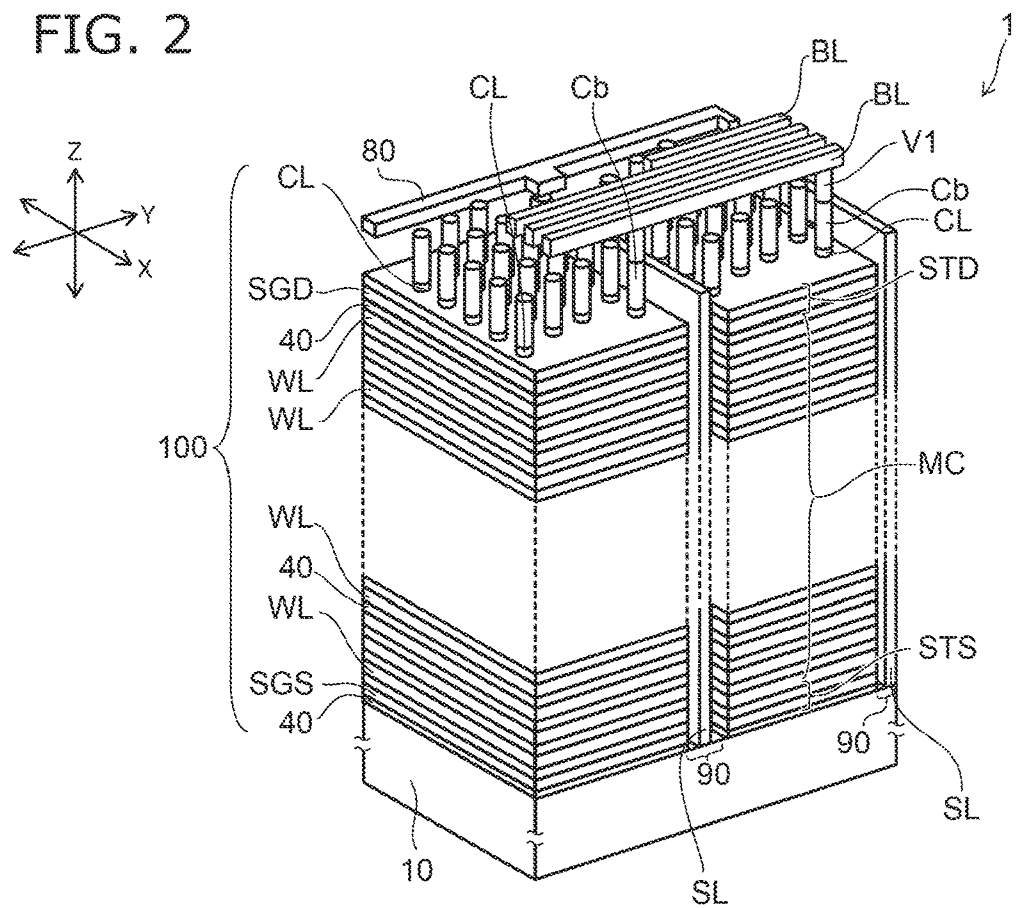
FIG. 2 is a schematic perspective view of a memory cell array of the first embodiment.

FIG. 1 is a schematic plane view showing a layout of the semiconductor device of the first embodiment. FIG. 2 is a schematic perspective view of a memory cell array 1 of the first embodiment. In FIG. 1 and FIG. 2, two mutually-orthogonal directions parallel to a major surface of a substrate are taken as an X-direction and a Y-direction. A direction orthogonal to both the X-direction and the Y-direction is taken as a Z-direction (the stacking direction of a stacked body 100).

As shown in FIG. 1, the semiconductor device of the first embodiment includes the memory cell array 1, a wall portion 60, and an insulating portion 85. The memory cell array 1 is surrounded with the insulating portion 85 and the wall portion 60. The wall portion 60 is provided in the insulating portion 85. A distance W1 is a distance between the wall portion 60 and one side surface of the memory cell array 1 in the X-direction, a distance W3 is a distance between the wall portion 60 and another side surface of the memory cell array 1 in the X-direction, a distance W2 is a distance between the wall portion 60 and one side surface of the memory cell array 1 in the Y-direction, and a distance W4 is a distance between the wall portion 60 and another side surface of the memory cell array 1 in the Y-direction.

As shown in FIG. 2, the memory cell array 1 is, for example, provided on the major surface of the substrate 10. The substrate 10 is, for example, a semiconductor substrate. The semiconductor substrate includes, for example, silicon. A conductivity type of the substrate 10 is, for example, p-type.

The memory cell array 1 includes the stacked body 100, a plurality of columnar portions CL, and a plurality of side wall portions 90. The stacked body 100 is provided on the major surface of the substrate 10. The stacked body 100 includes a plurality of electrode layers (SGS, WL, SGD) and a plurality of insulators 40. The plurality of electrode layers (SGS, WL, SGD) is stacked with the insulators 40 interposed. The electrode layer (SGS, WL, SGD) includes a conductive material. The conductive material includes, for example, tungsten. The insulator 40 may be insulating material being silicon oxide and so on, and may include air gap. The number of stacks of electrode layers (SGS, WL, SGD) is arbitrary.

The electrode layer SGS is a source-side select gate line. The electrode layer SGD is drain-side select gate line. The electrode layer WL is a word line. The source-side select gate line SGS is provided on the major surface of the substrate 10 via the insulator 40. A plurality of word lines WL is provided on the source-side select gate line SGS via the insulator 40. The drain-side select gate line SGD is provided on a top layer of the word lines WL via the insulator 40.

At least one of the source-side select gate lines SGS is used as a gate electrode of a source-side select transistor STS. At least one of the drain-side select gate lines SGD is used as a gate electrode of a drain-side select transistor STD. A plurality of memory cells MC is connected in series between the source-side select transistor STS and the drain-side select transistor STD. One of the word lines WL is used as a gate electrode of the memory cell MC.

The columnar portion CL is provided on the stacked body 100. The columnar portion CL extends in the Z-direction. The columnar portion CL is, for example, formed in a circular columnar configuration or an elliptical columnar configuration. The source-side select transistor STS, the drain-side select transistor STD, and the memory cell MC are disposed at the columnar portion CL.

A plurality of bit lines BL is provided above the columnar portion CL. The plurality of bit lines BL extends in the Y-direction and is disposed to be separated from each other in the X-direction. An upper end portion of the columnar portion CL is electrically connected to one of the bit lines BL via a contact portion Cb and a via V1.

The side wall portion 90 is provided in the stacked body 100. The side wall portion 90 extends along the Z-direction and the X-direction. A source line SL (conductive layer) is provided in the side wall portion 90. The source line SL includes a conductive material. The conductive material includes, for example, at least one of tungsten or titanium. The source line SL may include, for example, a stacked body formed of titanium and titanium nitride. The source line SL is electrically connected to the substrate 10.

An upper portion interconnect 80 is disposed above the source line SL. The upper portion interconnect 80 extends in the Y-direction. The upper portion interconnect 80 is electrically connected to the plurality of source layers SL arranged along the Y-direction. The upper portion interconnect 80 is electrically connected to a peripheral circuit not shown. A lower end portion of the source line SL is in contact with the substrate 10 and electrically connected to the columnar portion CL.

Figures 3A, 3B:
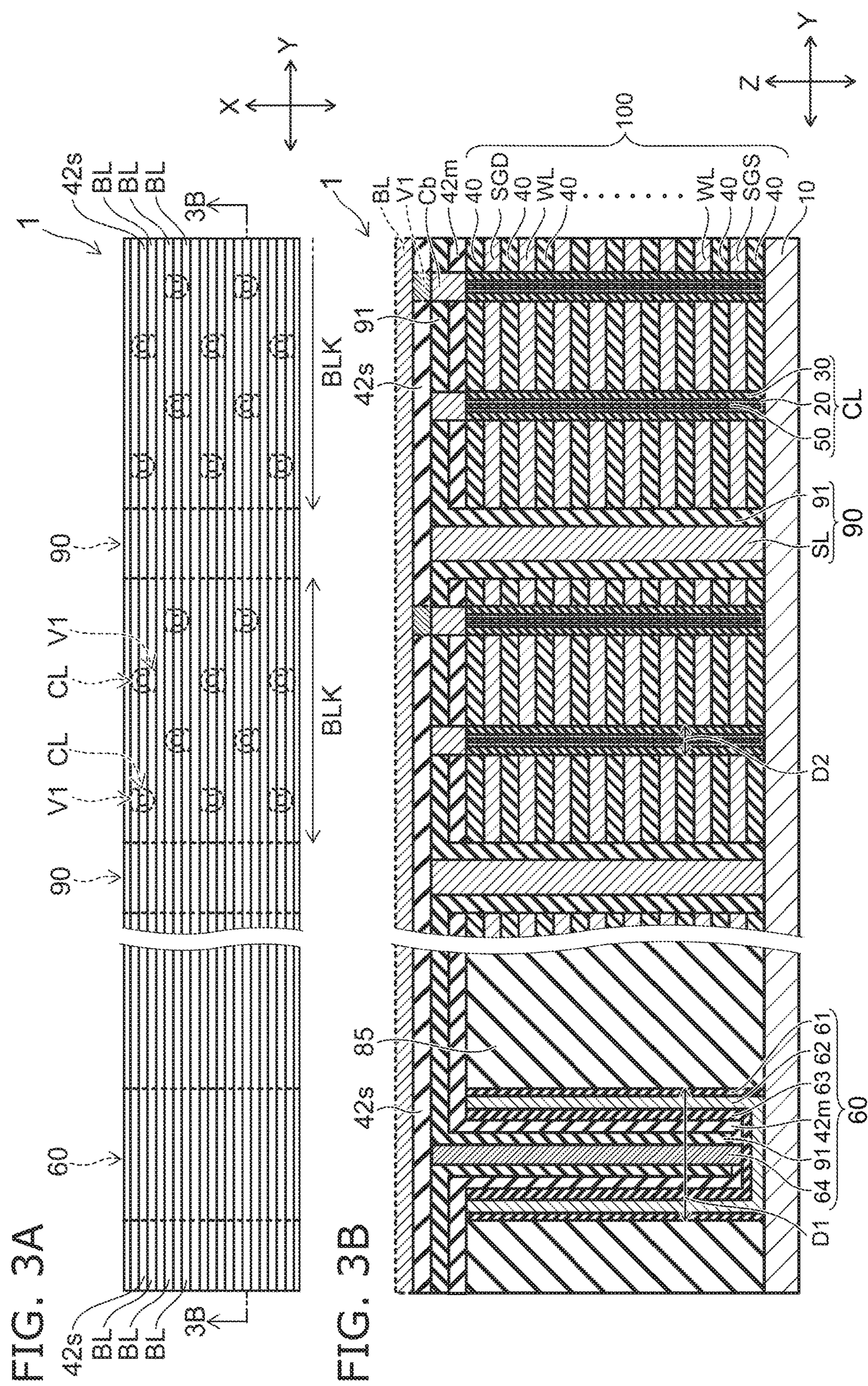
FIG. 3A is a schematic plane view in a frame 3A in FIG. 1.
FIG. 3B is a schematic cross-sectional view along a 3B-3B line in FIG. 3A.

FIG. 3A is an enlarged schematic plane view in a frame 3A in FIG. 1. FIG. 3B is a schematic cross-sectional view along a 3B-3B line in FIG. 3A. In FIG. 3B, the bit line BL and the via V1 provided at a back of a paper are shown by a broken line.

As shown in FIG. 3A and FIG. 3B, the columnar portion CL includes a memory film 30, a semiconductor body 20, and a core layer 50. The memory film 30, the semiconductor body 20, and the core layer 50 extend along the Z-direction. The memory film 30 is provided in contact with the stacked body 100. A configuration of the memory film 30 is, for example, a tubular configuration. The semiconductor body 20 is provided on the memory film 30. The semiconductor body 20 includes, for example, silicon. The silicon is, for example, polysilicon made of amorphous silicon that is crystallized. A lower end portion of the semiconductor body 20 is electrically connected to the substrate 10. The core layer 50 is provided on the semiconductor body 20. The core layer 50 has insulation. The core layer 50 includes, for example, silicon oxide. A configuration of the core layer 50 is, for example, a columnar configuration.

The side wall portion 90 separates the stacked body 100 into a plurality of portions in the Y-direction. The regions separated by the side wall portion 90 are called "block BLK". The columnar portions CL are disposed, for example, in a staggered lattice configuration or a square lattice configuration in each of the blocks BLK. One bit line BL is electrically connected to the columnar portion CL selected from the each block BLK one by one. The side wall portion 90 includes an insulating layer 91. The insulating layer 91 is provided between the source line SL and the stacked body 100. The insulating layer 91 includes, for example, silicon oxide.

An insulator 42*m*, an insulator 42*s* and the insulating layer 91 are provided on the stacked body 100 and the wall portion 60. The insulator 42*m* is provided on the columnar portion CL, and a height of the insulator 42*m* is a height of the columnar portion CL or more. The insulating layer 91 is provided on the insulator 42*m*. The insulator 42*s* is provided on the insulating layer 91, and provided on the side wall portion 90, and a height of the insulator 42*s* is a height of the side wall portion 90 or more. The insulator 42*m* and the insulator 42*s* include, for example, silicon oxide.

The wall portion 60 includes a first film 61, a second film 62, a third film 63, the insulator 42*m*, the insulating layer 91, and a conductive film 64. The first film 61 includes same as a material of the memory film 30, the second film 62 includes same as a material of the semiconductor body 20, and the third film 63 includes same as a material of the core layer 50. The conductive film 64 includes same as a material of the source line SL. A maximum width D1 of the wall portion 60 along the Y-direction is larger than the maximum diameter D2 of the columnar portion CL as viewed in the Z-direction.

In the manufacturing process of the semiconductor device, a thermal annealing is performed. The thermal annealing is performed in order to crystallize the semiconductor body 20 and so on. At this time, a thermal stress due to the insulating portion 85 directly surrounding the stacked body 100 is generated in the stacked body 100. This is because there is a difference between a linear expansion coefficient of the stacked body 100 and a linear expansion coefficient of the insulating portion 85. A load applied to the stacked body 100 by the thermal stress is dependent on a volume of the insulating portion 85 directly surrounding the stacked body 100. For example, when number of stacks of the stacked body 100 is increased, the volume of the insulating portion 85 surrounding the stacked body 100 is increased in the stacking direction. Therefore, due to increase number of stacks of the stacked body 100, the load applied to the stacked body 100 becomes larger, and the stacked body 100 is easily distorted. As a result, possibility of causing a short circuit between the bit line BL and the source line SL is high.

In contrast, in the first embodiment, the wall portion 60 is provided in the insulating portion 85. The wall portion 60 surrounds the stacked body 100. Thus, the volume of the insulating portion 85 directly surrounding the stacked body 100 is small as compared with the case without the wall portion 60. Thereby, the thermal stress generated in the stacked body 100 may be relaxed. Further, in the first embodiment, regardless of number of stacks of the stacked body 100, a height of the upper surface of the wall portion 60 is a height of the upper surface of the columnar portion CL or more. Thereby, when number of stacks of the stacked body 100 is also increased, the increasing of the volume of the insulating portion 85 directly surrounding the stacked body 100 may be suppressed, and the thermal stress generated in the stacked body 100 may be relaxed. Therefore, the inclining of the source line SL and the columnar portion CL those are provided on the side surface side of the stacked body 100 may be suppressed. As a result, the potential to cause short-circuiting between the bit line BL and the source line SL may be suppressed.

Further, in the first embodiment, each of the distances W1 to W4 between the wall portion 60 and the memory cell array 1 are uniform. Thus, each of volumes of the insulating portion 85 provided between the wall portion 60 and each of the side surfaces of the stacked body 100 is uniform. Thereby, values of the thermal stress generated respectively in each of side surfaces of the stacked body 100 may be uniform, and the inclining of the source line SL and the columnar portion CL may be suppressed.

Figure 4:
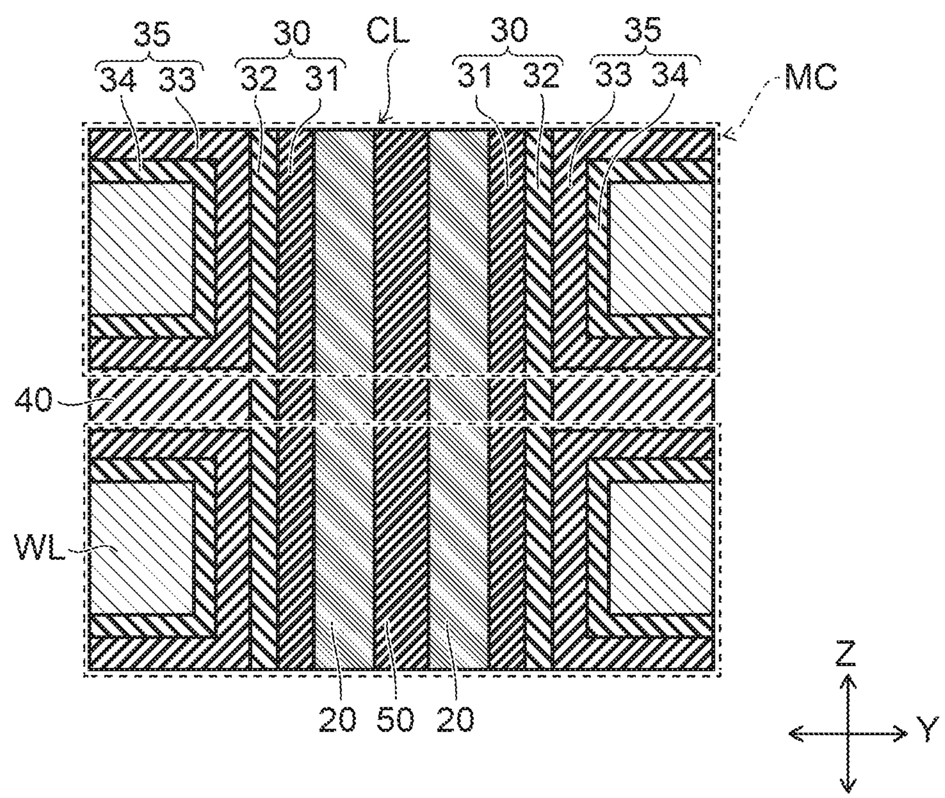
FIG. 4 is an enlarged schematic cross-sectional view of a part of a columnar portion of the first embodiment.

FIG. 4 is an enlarged schematic cross-sectional view of the columnar portion CL of the embodiment. In FIG. 4, among the electrode layers (SGS, WL, SGD), it will be described with the word line only shown.

As shown in FIG. 4, the memory film 30 includes a tunneling insulating film 31 and a charge storage film 32. The tunneling insulating film 31 is provided between the semiconductor body 20 and the charge storage film 32.

The tunneling insulating film 31 includes, for example, a silicon oxide or a stacked bode formed of a silicon oxide and a silicon nitride. The tunneling insulating film 31 is a potential barrier between the charge storage film 32 and the semiconductor body 20. When a charge is injected from the semiconductor body 20 into the charge storage film 32 (writing operation) and a charge is emitted from the charge storage film 20 to the semiconductor body 20 (erasing operation), the charge tunnels through the tunneling insulating film 31.

The charge storage film 32 includes, for example, a silicon nitride. The charge storage film 32 may include a hafnium oxide other than the silicon nitride. The charge storage film 32 includes a trap site trapping a charge in the film. The charge is trapped in the trap site. A threshold value of the memory cell MC changes depending on presence or absence of the charge trapped at the trap site and the amount of trapped charge. Thereby, the memory cell MC holds information.

Although not illustrated in FIG. 4, the memory film 30 may include, for example, a cover insulating film. The cover insulating film is provided between the charge storage film 32 and the insulator 40. The cover insulating film includes, for example, silicon oxide. The cover insulating film may be, for example, a stacked body including silicon oxide and aluminum oxide. For example, when the word line WL is formed, the cover insulating film protects the charge storage film 32 from etching.

The stacked body 100 includes a blocking insulating film 35. The blocking insulating film 35 is provided between the word line WL and the insulator 40, and between the word line WL and the charge storage film 32. The blocking insulating film 35 suppresses, for example, back-tunneling of the charge from the word line WL into the charge storage film 32 in the erasing operation. The blocking insulating film 35 includes, for example, a first blocking insulating layer 33 and a second blocking insulating layer 34.

The first blocking insulating layer 33 is provided on the memory film 30 side. The second blocking insulating layer 34 is provided between the first blocking insulating layer 33 and the word line WL. The first blocking insulating layer 33 includes a material different from the second blocking insulating layer 34. For example, the first blocking insulating layer 33 is an insulating material having a silicon oxide as a major component. The second blocking insulating layer 34 is an insulating material having a metal oxide as a major component. The metal is, for example, aluminum. The first blocking insulating layer 33 has a first relative dielectric constant. The second blocking insulating layer 34 has a second relative dielectric constant higher than the first relative dielectric constant.

Although not illustrated in FIG. 4, for example, a barrier film may be provided between the blocking insulating film 35 and the word line WL. The barrier film includes, for example, a titanium nitride, or titanium and the titanium nitride.

First Embodiment: Manufacturing Method

Next, one example of a method for manufacturing the semiconductor device of the embodiment will be described. FIG. 5A to FIG. 12B are schematic views showing the method for manufacturing the semiconductor device of the embodiment. FIG. 5A, FIG. 6A, FIG. 7A, FIG. 8A, FIG. 9A, FIG. 10A, FIG. 11A, and FIG. 12A are schematic plane views of the semiconductor device of the embodiment. FIG. 5B, FIG. 6B, FIG. 7B, FIG. 8B, FIG. 9B, FIG. 10B, FIG. 11B, and FIG. 12B are schematic cross-sectional views shown a dashed line of each of the plane views described above.

<Forming the Stacked Body 100>

Figure 5A:
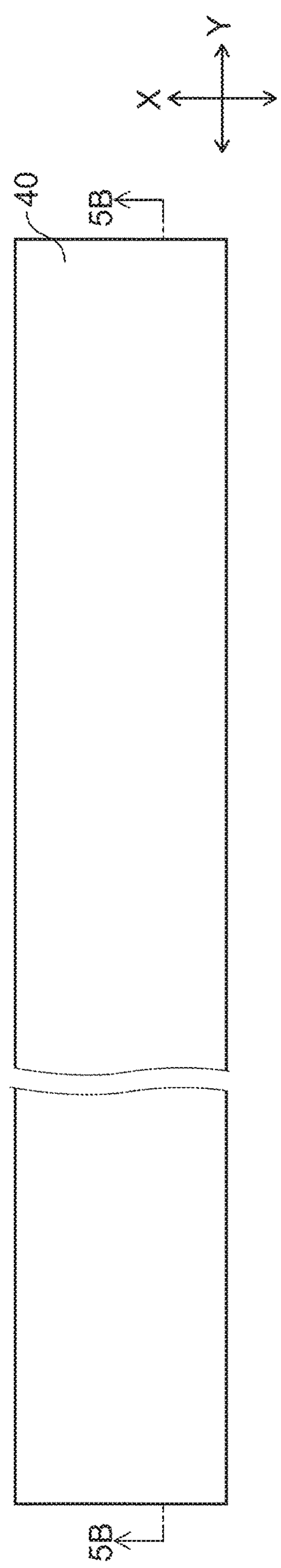
FIG. 5A to FIG. 12B are schematic views showing a method for manufacturing the semiconductor device of the first embodiment.
Figure 5B:
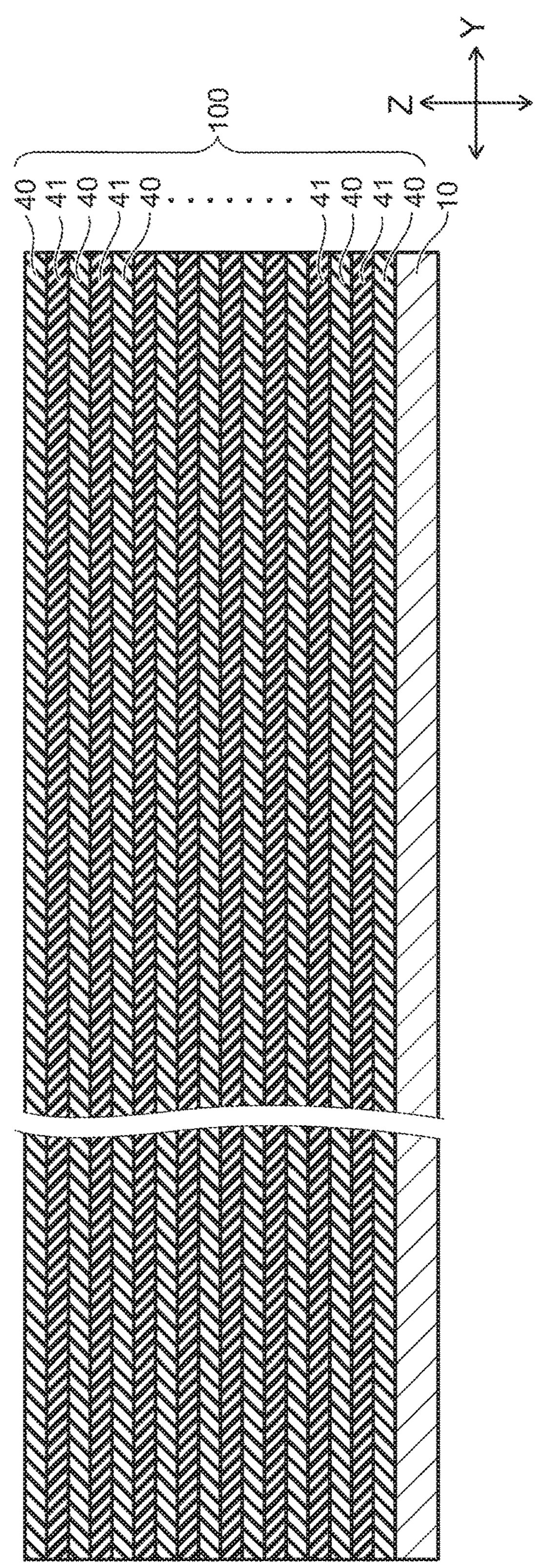

As shown in FIG. 5A and FIG. 5B, the stacked body 100 is formed on the substrate 10. The stacked body 100 is in a state where the replacement members 41 (first layers) and the insulators 40 are alternately stacked. The replacement member 41 is a member to be replaced by the electrode layers (SGS, WL, SGD) later. The material of the replacement member 41 is selected from materials that can take an etching selection ratio to the insulator 40. For example, when a silicon oxide is selected as the insulator 40, a silicon nitride is selected as the replacement member 41.

<Forming the Insulating Portion 85>

Figure 6A:
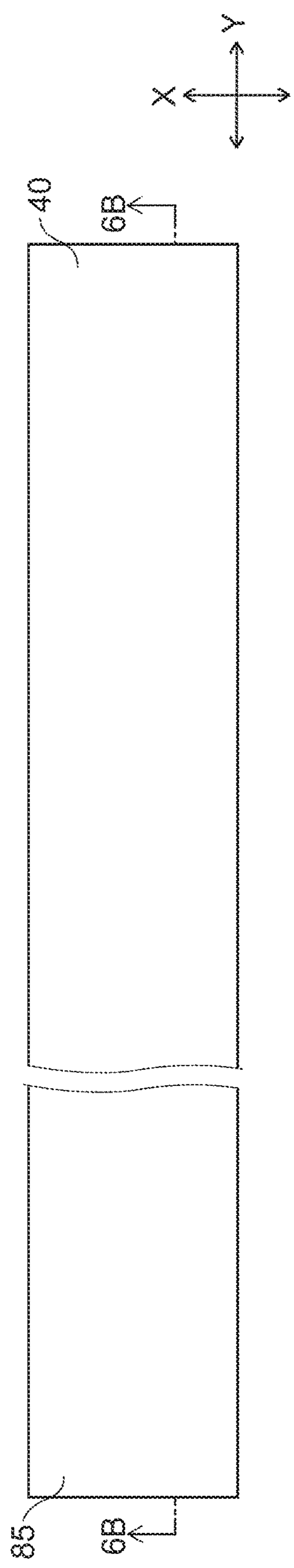
Figure 6B:
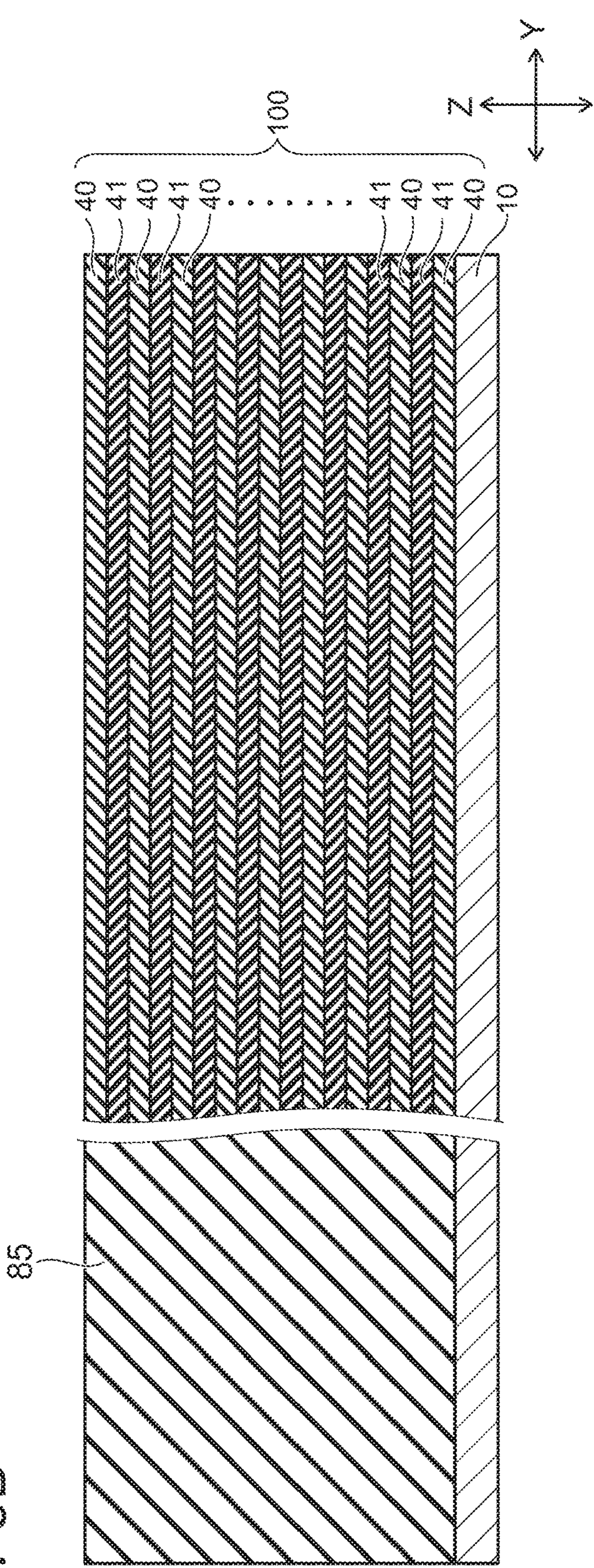

Next, as shown in FIG. 6A and FIG. 6B, a part of the stacked body 100 is removed. The insulating portion 85 is formed in a portion where the stacked body 100 is removed. At this time, as shown in FIG. 1, the stacked body 100 is surrounded with the insulating portion 85. Silicon oxide is, for example, selected as the insulating portion 85. After that, an upper portion of the insulating portion 85 is flattened. The insulating portion 85 is flattened, for example, using CMP (Chemical Mechanical Polishing).

<Forming the Slit 605>

Figure 7A:
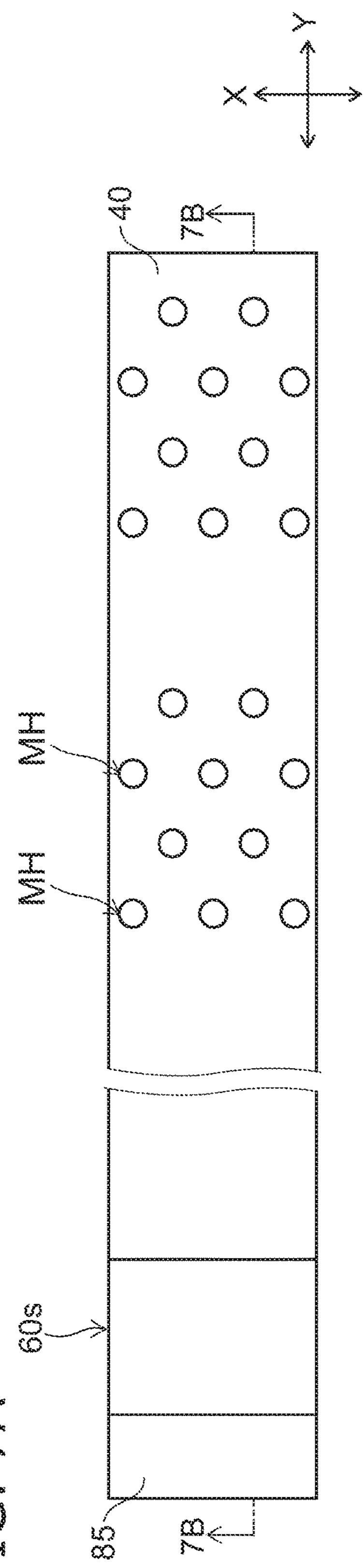
Figure 7B:
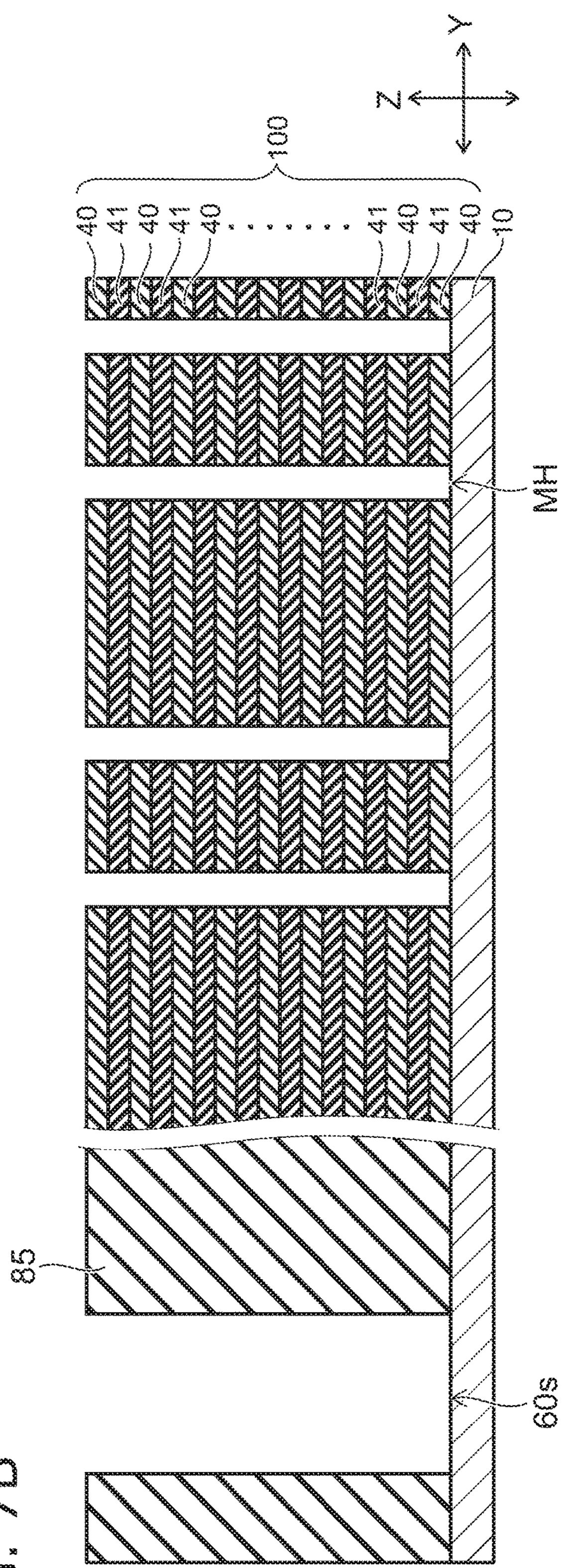

Next, as shown in FIG. 7A and FIG. 7B, a slit 60*s* formed in the insulating portion 85. The slit 60*s* pierces the insulating portion 85 and reaches the substrate 10. The stacked body 100 is surrounded with the slit 60*s*. Each of distances between the slit 60*s* and each of side surfaces of the stacked body 100 is uniform. Next, a plurality of holes MH is formed in the stacked body 100. The hole MH pierces the stacked body 100 and reaches the substrate 10. The slit 60*s* and the hole MH are formed by photolithography and etching. The etching may be, for example, used RIE (Reactive Ion Etching) method.

<Forming the Columnar Portion CL>

Figure 8A:
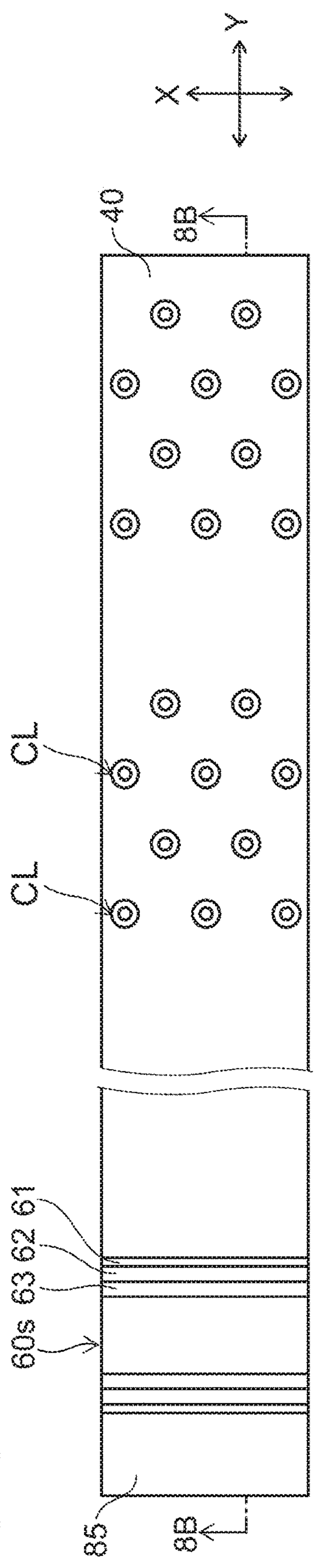
Figure 8B:
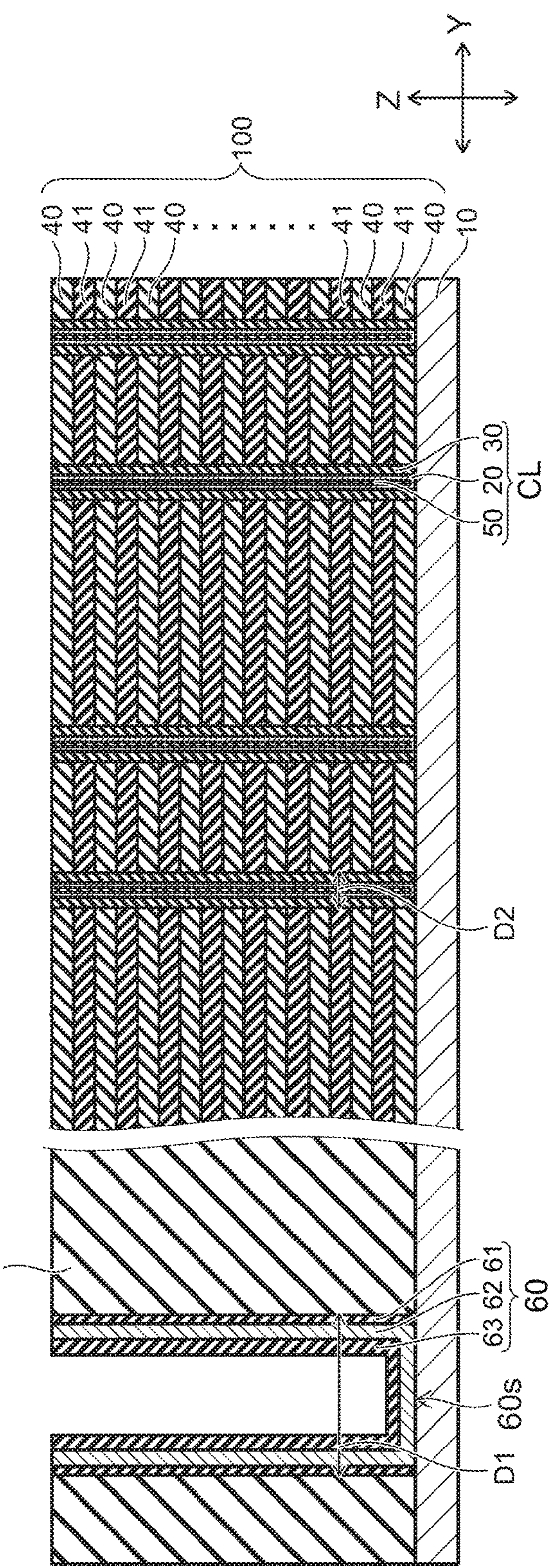

Next, as shown in FIG. 8A and FIG. 8B, the memory film 30 is formed on a side wall of the hole MH, and the first film 61 is formed on a side wall of the slit 60*s*. As the memory film 30 and the first film 61, each of the films (the tunneling insulating film 31, the charge storage film 32) shown in FIG.

4 is formed. Next, a bottom of the memory film 30 is removed. Thereby, the substrate 10 is exposed on a bottom of the hole MH. When the bottom of the memory film 30 is removed, for example, the first film 61 may be simultaneously removed. Next, the semiconductor body 20 is formed on the memory film 30, and the second film 62 is formed on the first film 61. Amorphous silicon is, for example, selected as the semiconductor body 20 and the second film 62. Next, the core layer 50 is formed on the semiconductor body 20, and the third film 63 is formed on the second film 62. Silicon oxide is, for example, selected as the core layer 50 and the third film 63. At this time, the hole MH is filled with the core layer 50. In contrast, the slit 60*s* is not filled with the third film 63, and a space is formed in the slit 60*s*. It is because, along the Y-direction, a maximum width D1 of the slit 60*s* is larger than a maximum diameter D2 of the hole MH as viewed in the Z-direction. As a method forming the memory film 30, the semiconductor body 20, the core layer 50, and the first film 61 to the third film 63, for example, at least one of CVD (Chemical Vapor Deposition) method or ALD (Atomic Layer Deposition) method is used.

After that, by the amorphous silicon selected as the semiconductor body 20 is performed thermal annealing in order to crystallization, the columnar portion CL is formed. At this time, the thermal stress due to the insulating portion 85 directly surrounding the stacked body 100 is generated in the stacked body 100. Thereby, there is a possibility that the columnar portion CL formed a side surface side of the stacked body 100 is inclined. In this regard, in the first embodiment, the slit 60*s* is formed in the insulating portion 85. At this time, a volume of the insulating portion 85 directly surrounding the stacked body 100 is small as compared with the case of not forming the slit 60*s*. Further, the thermal stress due to the insulating portion 85 directly surrounding the stacked body 100 is dispersed in the stacked body 100 and in the first film 61 to the third film 63 in the slit 60*s*. For these reasons, the thermal stress generated in the stacked body 100 may be relaxed. Thereby, the inclining of the columnar portion CL formed on the side surface side of the stacked body 100 may be suppressed.

<Forming the Electrode Layer (SGS, WL, SGD): Replace Process>

Figure 9A:
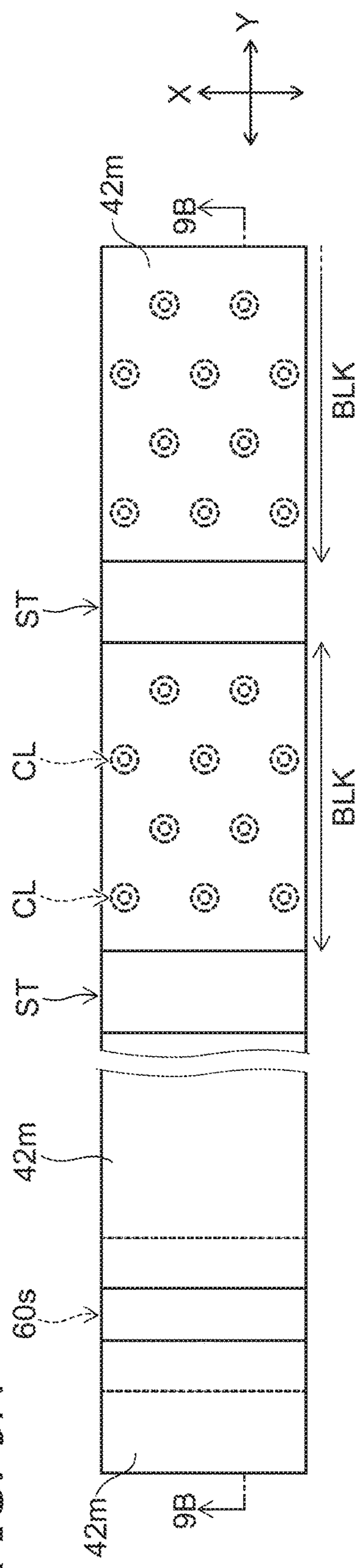
Figure 9B:
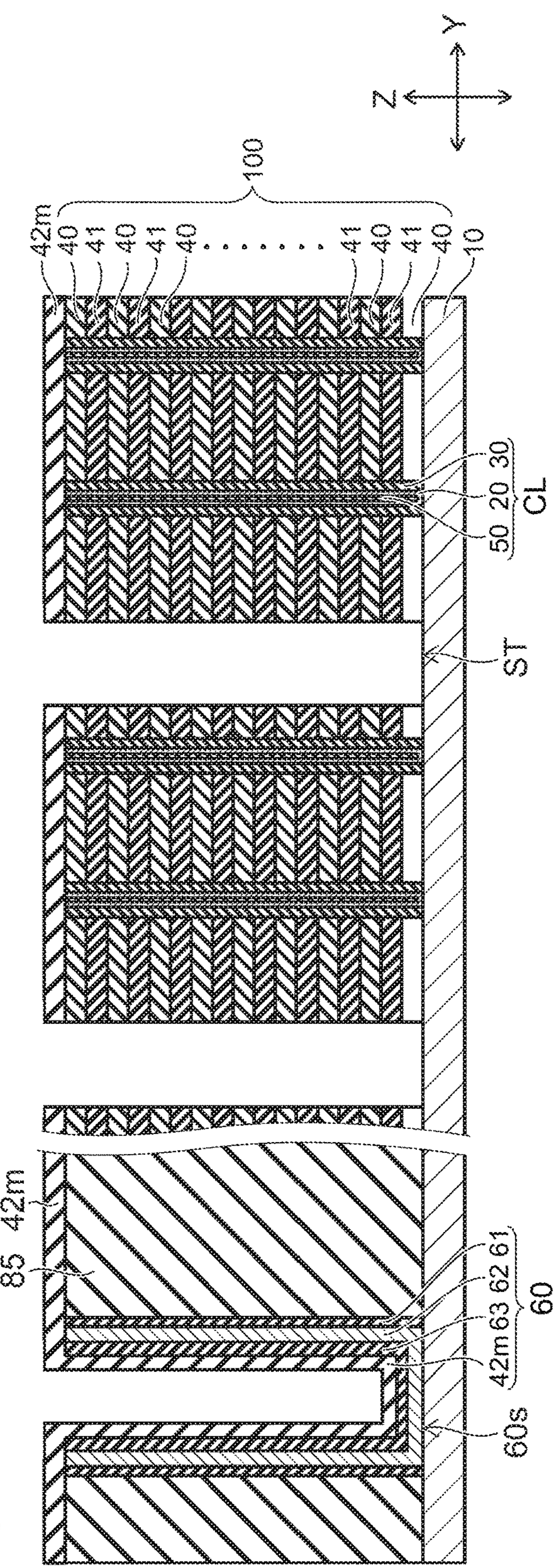

Next, as shown in FIG. 9A and FIG. 9B, the insulator 42*m* is formed on the stacked body 100, the insulating portion 85, and the third film 63. Silicon oxide is, for example, selected as the insulator 42*m*. As a method forming the insulator 40, for example, at least one of CVD method or ALD method is used. After that, a slit ST is formed in the stacked body 100. The slit ST pierces the insulator 42*m* and the stacked body 100, and reaches the substrate 10. The slit ST extends in the X-direction.

Figure 10A:
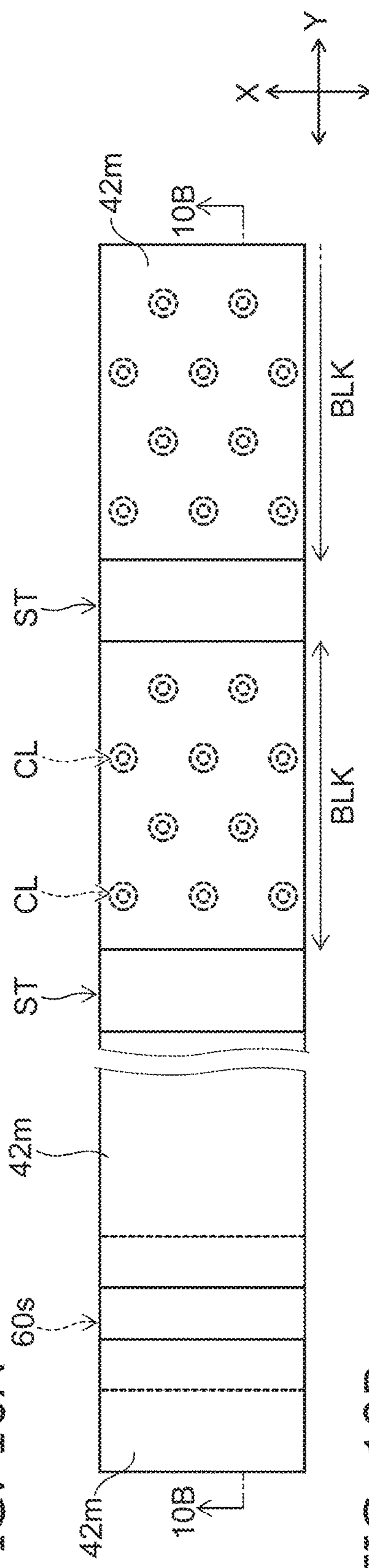
Figure 10B:
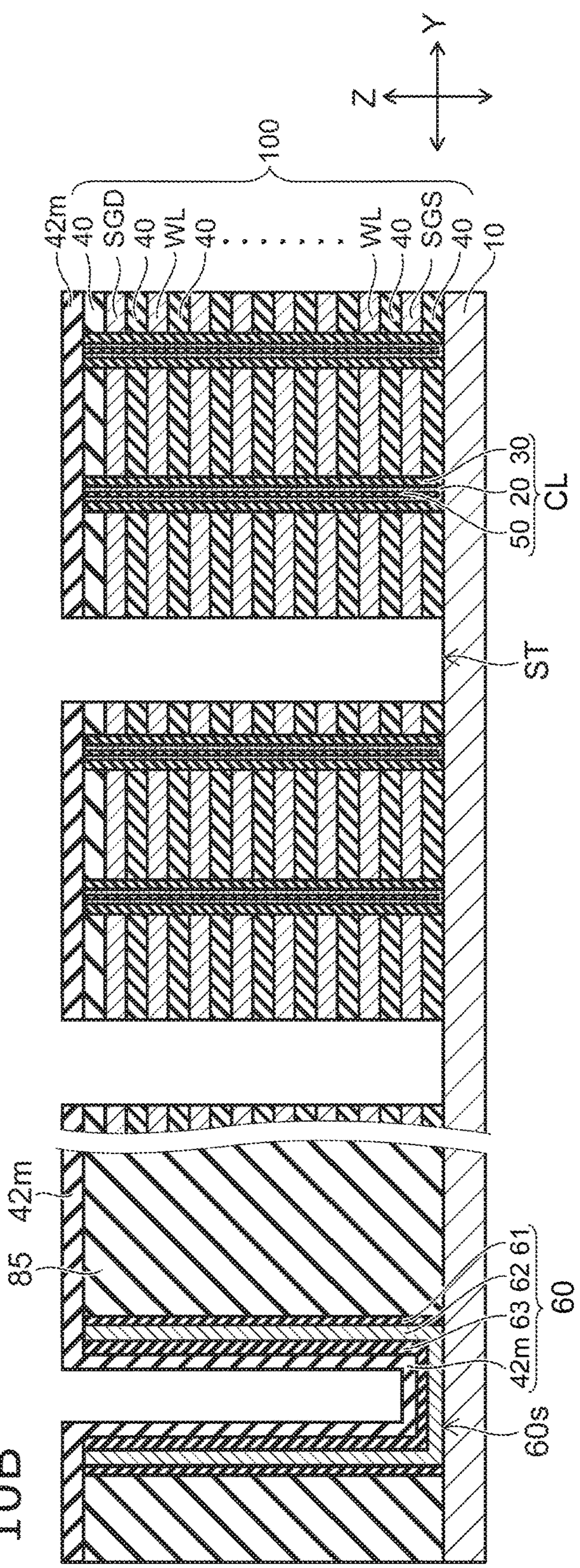

Next, as shown in FIG. 10A and FIG. 10B, the replacement member 41 is removed from the stacked body 100 via the slit ST. After that, the blocking insulating film 35 (FIG. 10B omitted in later) and the electrode layer (SGS, WL, SGD) are formed in a place where the replacement member 41 is removed. Tungsten is, for example, selected as the electrode layer (SGS, WL, SGD).

Here, when the blocking insulating film 35 is formed, the thermal annealing may be performed. In this case, similarly to the case of forming the columnar portion CL, the thermal stress due to the insulating portion 85 is generated in the stacked body 100. Thereby, the configuration of the slit ST in the stacked body 100 is changed, and the source line SL may be formed to incline. In this regard, in the first embodiment, the slit 60*s* is formed in the insulating portion 85. Thus, the thermal stress generated in the stacked body 100 may be relaxed. Thereby, the source line SL obliquely formed may be suppressed. Here, the slit 60*s* may be, for example, filled with the insulator 42*m*. Also in this case, the thermal stress generated in the stacked body 100 may be relaxed.

<Forming the Side Wall Portion 90 and the Wall Portion 60>

Figure 11A:
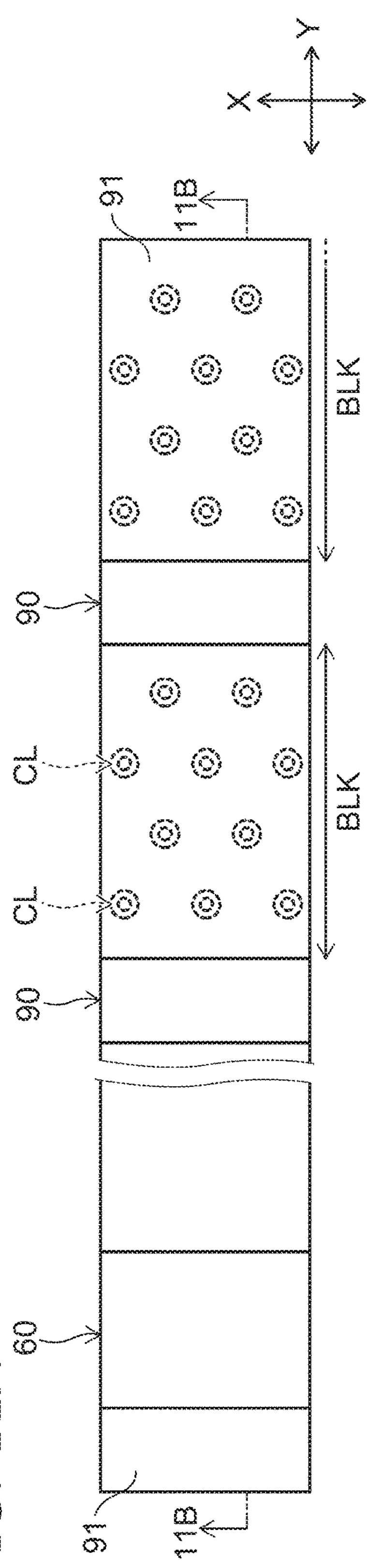
Figure 11B:
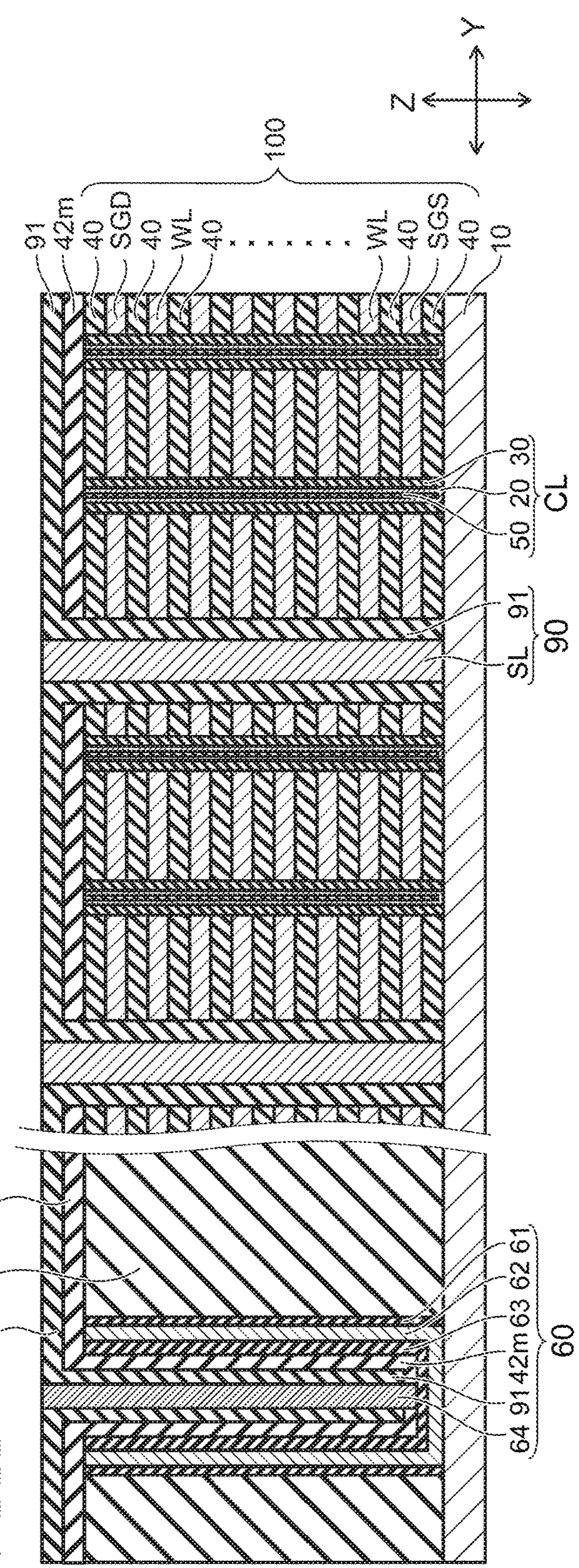

Next, as shown in FIG. 11A and FIG. 11B, the insulating layer 91 is formed on the side wall of the slit ST and on the insulator 42*m*. Silicon oxide is, for example, selected as the insulating layer 91. As a method forming the insulating layer 91, for example, at least one of CVD method or ALD method, using tetrachlorosilane gas ($SiCl_4$) or tetrafluorosilane gas ($SiF_4$), is used.

After that, the source line SL is formed on the insulating layer 91. Tungsten is, for example, selected as the source layer SL. As a method forming the source line SL, at least one of CVD method or ALD method, using tungsten hexafluoride gas ($WF_6$) or hexachlorotungsten gas ($WCl_6$), is used. Further, the source line SL formed on each of the slits ST, 60*s* is, for example, removed by CMP method. The source line SL leaving in the slit 60*s* is used as the conductive film 64. Thereby, the side wall portion 90 and the wall portion 60 are formed.

<Forming the Contact Portion Cb and the Via V1>

Figure 12A:
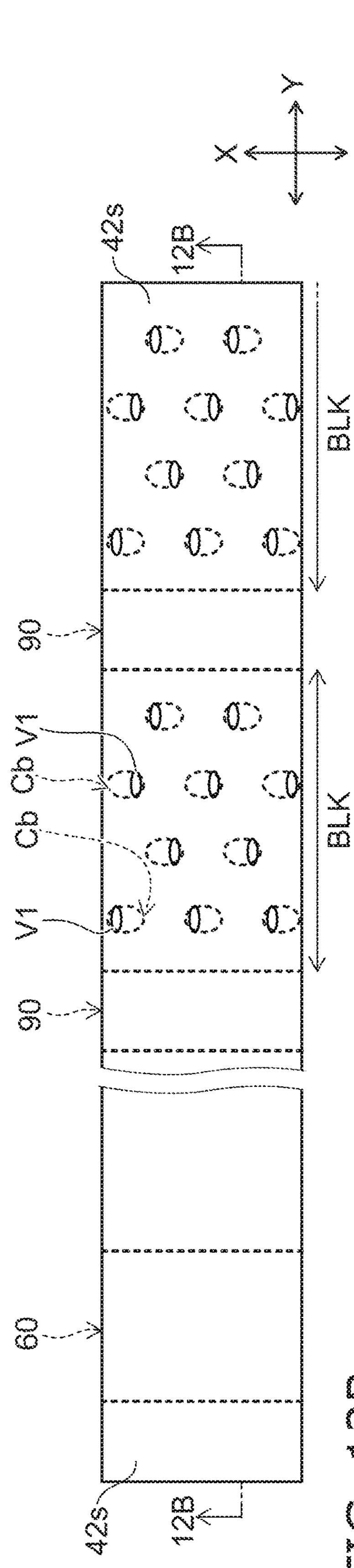
Figure 12B:
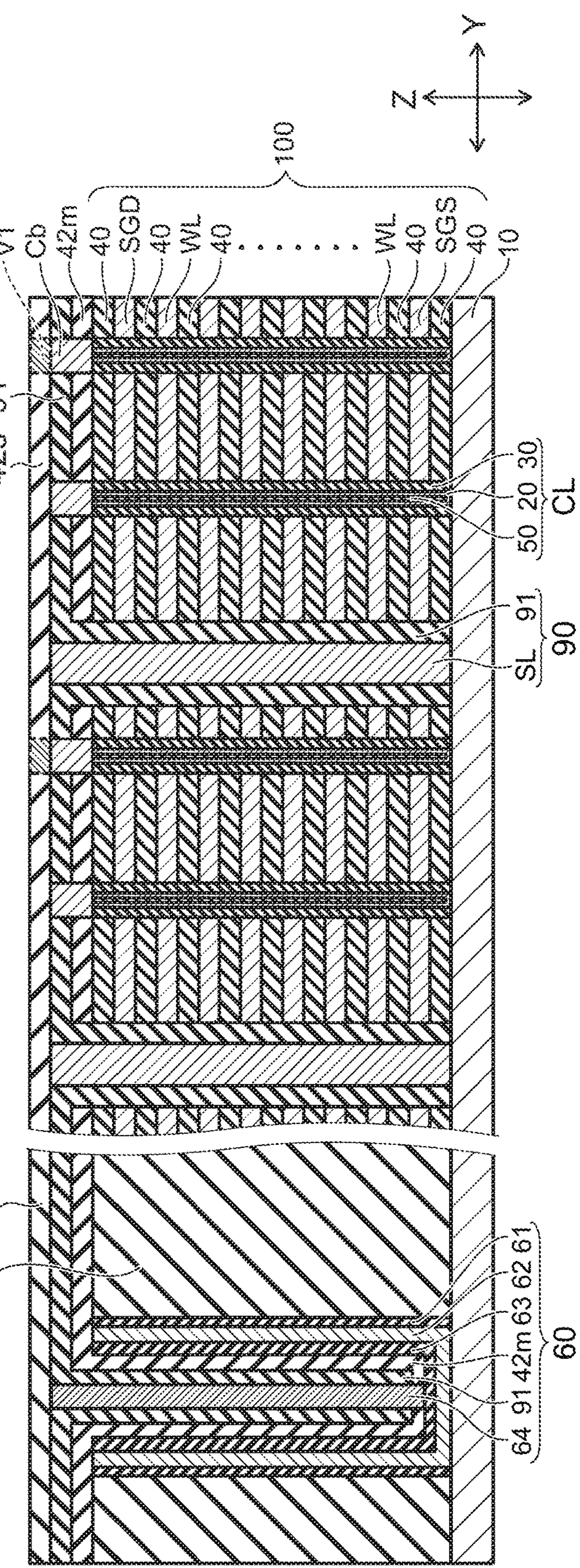

Next, as shown in FIG. 12A and FIG. 12B, the contact portion Cb is formed on the columnar portion CL. Tungsten is, for example, selected as the contact portion Cb. After that, the insulator 42*s* is formed on the contact portion Cb, the insulating layer 91, the side wall portion 90, and wall portion 60. Next, the via V1 is formed on the contact portion Cb. Tungsten is, for example, selected as the via V1.

<Forming the Bit Line BL>

After that, as shown in FIG. 3A and FIG. 3B, the bit line BL is formed on the via V1 and on the insulating portion 85. The bit line BL is in contact with the via V1, and is electrically connected to the columnar portion CL. The semiconductor device of the first embodiment may be, for example, manufactured by the method for manufacturing above described. For example, by selecting a metal member instead of the replacement member 41, the semiconductor device may be formed without performing replace process.

Here, also in the case of performing the thermal annealing different from above described, by forming the slit 60*s* (the wall portion 60) in the insulating portion 85, the thermal stress generated in the stacked body 100 may be relaxed. In the following embodiment it is also the same.

Second Embodiment: Semiconductor Device

Figure 13A:
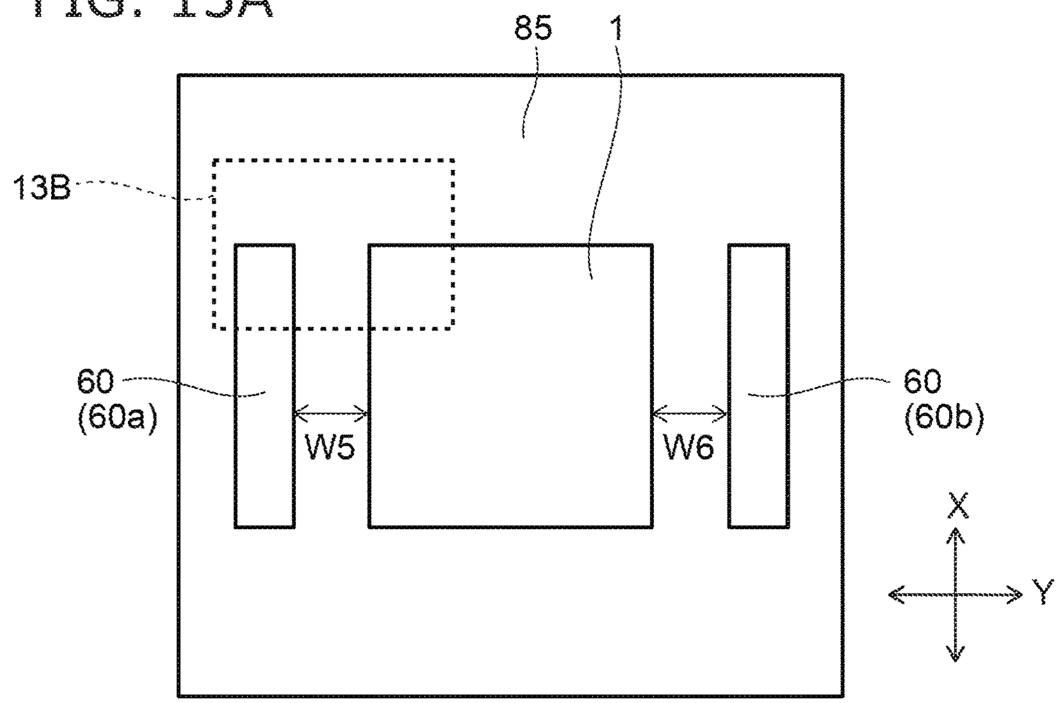
FIG. 13A is a schematic plane view showing a layout of the semiconductor device of a second embodiment.
Figure 13B:
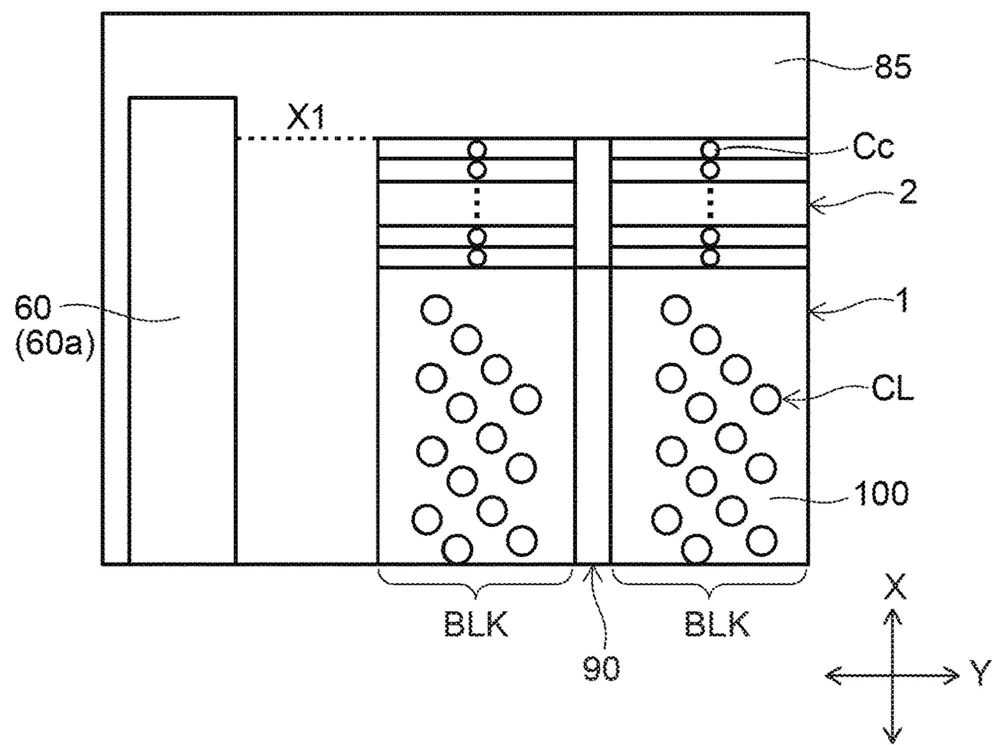
FIG. 13B is an enlarge schematic plane view in a frame 13B in FIG. 13A.

FIG. 13A is a schematic plane view showing a layout of the semiconductor device of a second embodiment. FIG. 13B is an enlarge schematic plane view in a frame 13B in FIG. 13A.

As shown in FIG. 13A and FIG. 13B, the semiconductor device of the second embodiment is different from the semiconductor device of the first embodiment in that the wall portion 60 is not provided in a position separated from the memory cell array 1 in the X-direction.

As shown in FIG. 13A, the memory cell array 1 is provided between pair of wall portions 60 (first wall portion 60*a*, second wall portion 60*b*), along the Y-direction. Each of wall portions 60 extends in the X-direction and is separated from each other.

Here, each of blocks BLK in the memory cell array 1 extends in the X-direction, and is separated from each other in the Y-direction. Thus, most located outside the block BLK are susceptible to given a load along the Y-direction compared to a load applied along the X-direction. In this regard, in the second embodiment, the wall portions 60*a*, 60*b* are provided to interpose the memory cell array 1 along the Y-direction. Thus, along the Y-direction, the thermal stress generated in the stacked body 100 may be relaxed. Thereby, the load applied to most located outside the block BLK may be suppressed, and the inclining of the columnar portion CL and the source line SL disposed in the block BLK may be suppressed.

Further, as shown in FIG. 13B, a staircase structure portion 2 is, for example, provided at the side surface of the memory cell array 1 in the X-direction. A plurality of contact portion Cc is provided in the staircase structure portion 2. The contact portions Cc are electrically connected to respectively the electrode layers (SGS, WL, SGD) of the memory cell array 1. The side wall portion 90 extends from the memory cell array 1 to the staircase structure portion 2. In the second embodiment, each of the wall portions 60*a*, 60*b* extends to the outside than the position X1 of the side surface of the staircase structure portion 2, along the X-direction. At this time, along the X-direction, lengths of each of the wall portions 60*a*, 60*b* extending are larger than a length of the side wall portion 90 extending. Thus, along the Y-direction, the thermal stress generated in the staircase structure portion 2 may be relaxed. Thereby, the load applied to a side surface of the staircase structure portion 2 in the Y-direction may be suppressed, and the inclining of the side wall portion 90 may be suppressed.

Further, in the second embodiment, a distance W5 between the memory cell array 1 and the first wall portion 60*a* is equal to a distance W6 between the memory cell array 1 and the second wall portion 60*b*. Thereby, along the Y-direction, the thermal stresses generated in both of side surfaces of the memory cell array 1 may be uniform, and the inclining of the source line SL and the columnar portion CL may be suppressed.

In addition to the above, in the second embodiment, the wall portion 60 is not provided on a region along X-direction from the memory cell array 1. Therefore, it is possible to minimize the enlargement of chip size due to the forming the wall portion 60.

Third Embodiment: Semiconductor Device

Figure 14C:
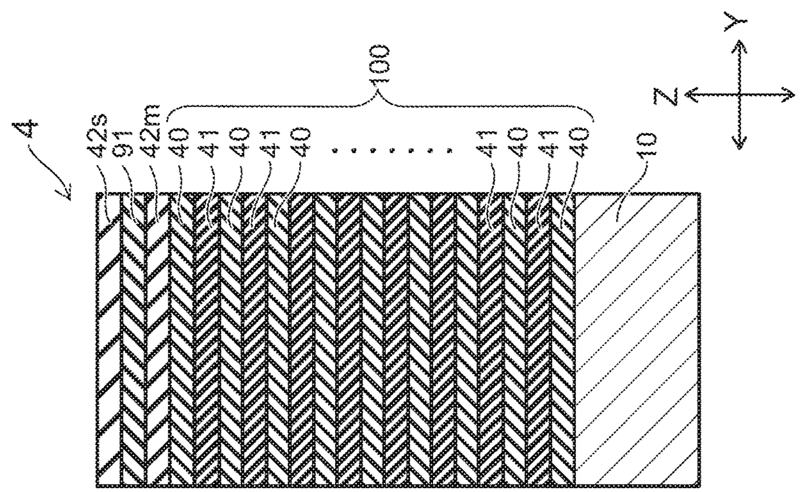
FIG. 14C is a schematic cross-sectional view showing a part of an outer peripheral portion of the third embodiment.
Figure 14B:
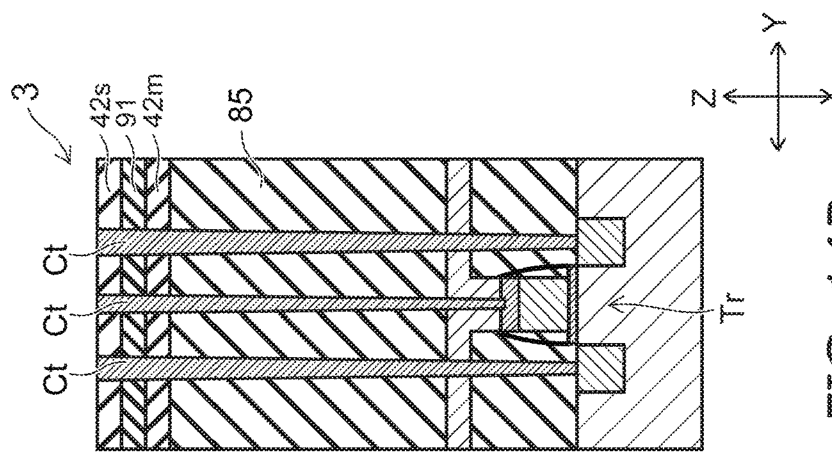
FIG. 14B is a schematic cross-sectional view showing a part of a peripheral circuit of the third embodiment.
Figure 14A:
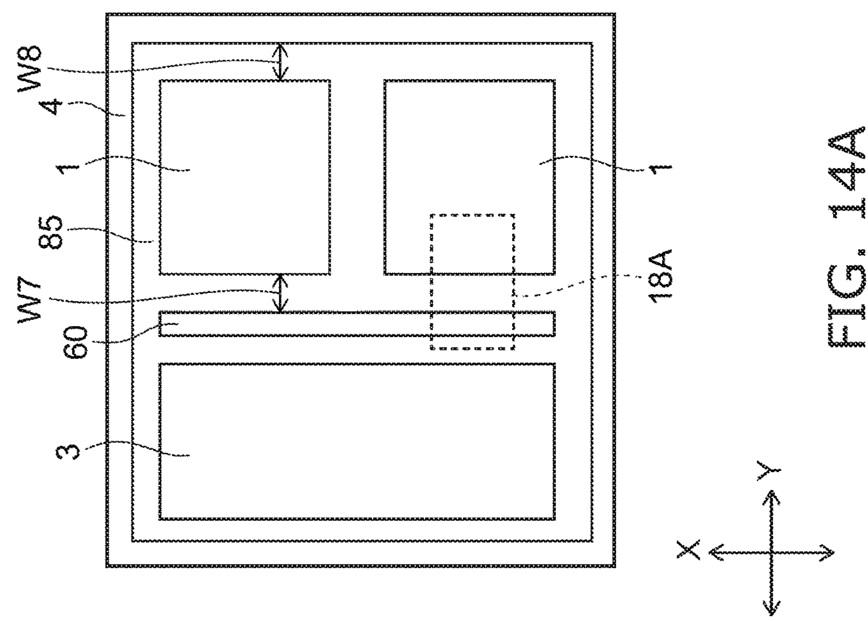
FIG. 14A is a schematic plane view showing a layout of the semiconductor device of a third embodiment.

FIG. 14A is a schematic plane view showing a layout of the semiconductor device of a third embodiment. FIG. 14B is a schematic cross-sectional view showing a part of a peripheral circuit 3. FIG. 14C is a schematic cross-sectional view showing a part of an outer peripheral portion 4.

As shown in FIG. 14A to FIG. 14C, the semiconductor device of the third embodiment is different from the semiconductor device of the first embodiment in that the peripheral circuit 3 is provided, an upper surface of the peripheral circuit 3 is covered with the insulating portion 85, and the outer peripheral portion 4 is provided to surround the memory cell array 1, the peripheral circuit 3, and the wall portion 60.

The peripheral circuit 3 includes a plurality of transistors Tr. The plurality of transistors Tr is, for example, electrically connected to the upper portion interconnect 80 shown in FIG. 2, for example, via a contact portion Ct. The outer peripheral portion 4 includes, for example, the plurality of replacement members 41 and the plurality of insulators 40. The plurality of replacement members 41 is stacked with the insulator 40 interposed. The number of stacks of the stacked body of the outer peripheral portion 4 is, for example, equal to the number of stacks of the stacked body 100 of the memory cell array 1.

The wall portion 60 is provided between the peripheral circuit 3 and the memory cell array 1. Here, a volume of the insulating portion 85 on the peripheral circuit 3 is large as compared with a volume of the insulating portion 85 between the wall portion 60 and the memory cell array 1. Thus, in the case the thermal stress due to the insulating portion 85 on the peripheral circuit 3 is generated in the memory cell array 1, the stacked body 100 is easily distorted. In this regard, in the third embodiment, the thermal stress due to the insulating portion 85 on the peripheral circuit 3 is mainly generated in the wall portion 60. Thus, the thermal stress generated in the memory cell array 1 may be relaxed. Thereby, the inclining of the source line SL and the columnar portion CL may be suppressed.

Further, along Y-direction, a distance W7 between the memory cell array 1 and the wall portion 60 is equal to a distance W8 between the memory cell array 1 and the outside peripheral portion 4. Thereby, along Y-direction, the thermal stresses generated in both of side surfaces of the memory cell array 1 may be uniform, and the inclining of the source line SL and the columnar portion CL may be suppressed.

Third Embodiment: Manufacturing Method

Next, one example of a method for manufacturing the semiconductor device of the third embodiment will be described.

Figure 15A:
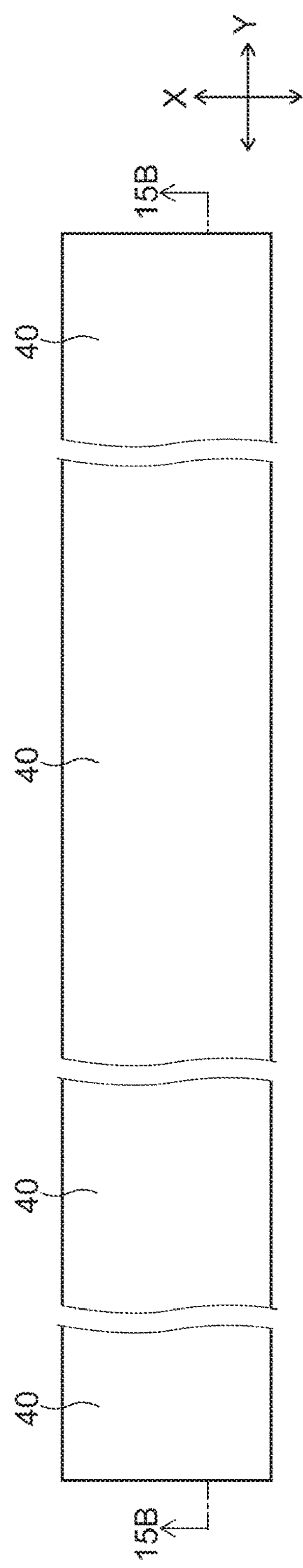
FIG. 15A to FIG. 17B are schematic views showing a method for manufacturing the semiconductor device of the third embodiment.
Figure 15B:
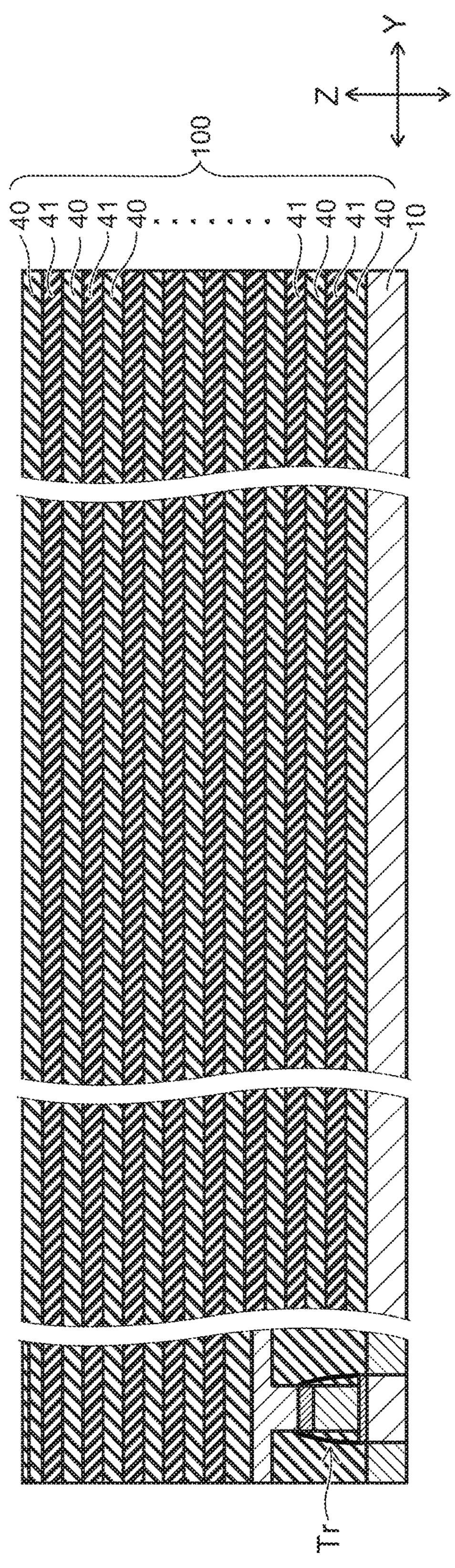
Figure 16A:
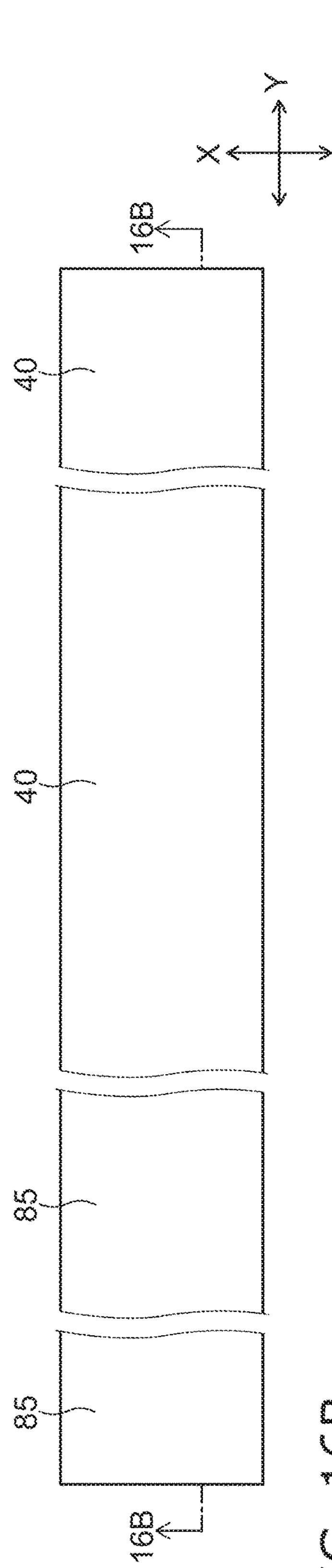
Figure 16B:
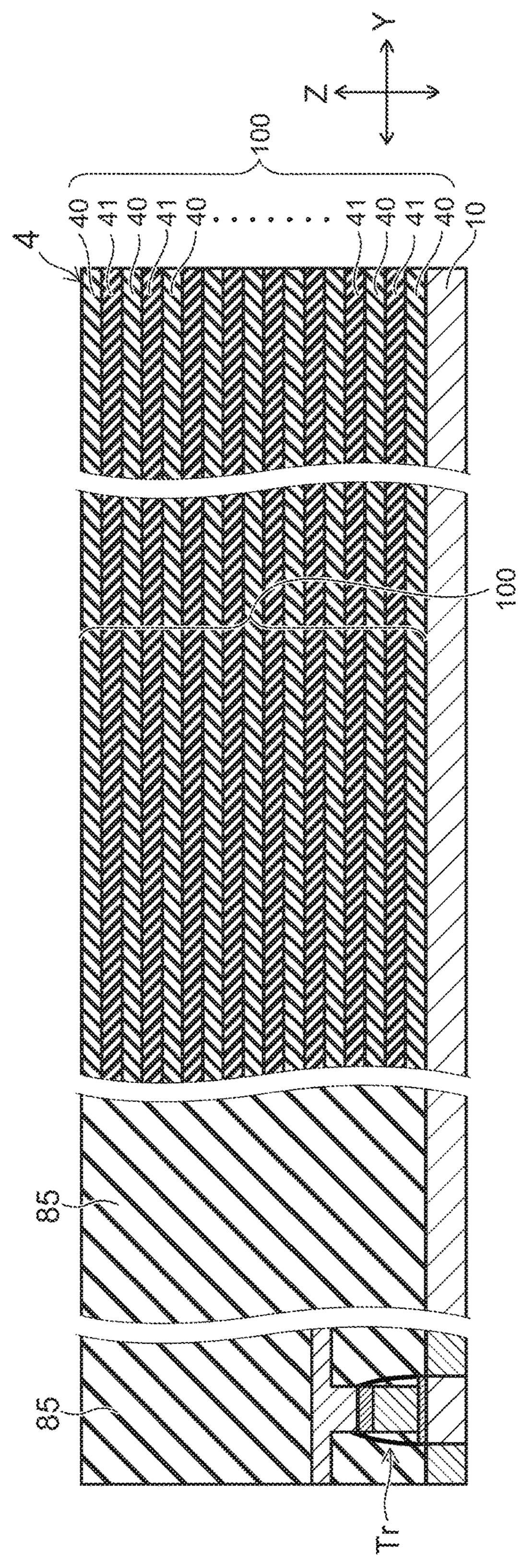
Figure 17A:
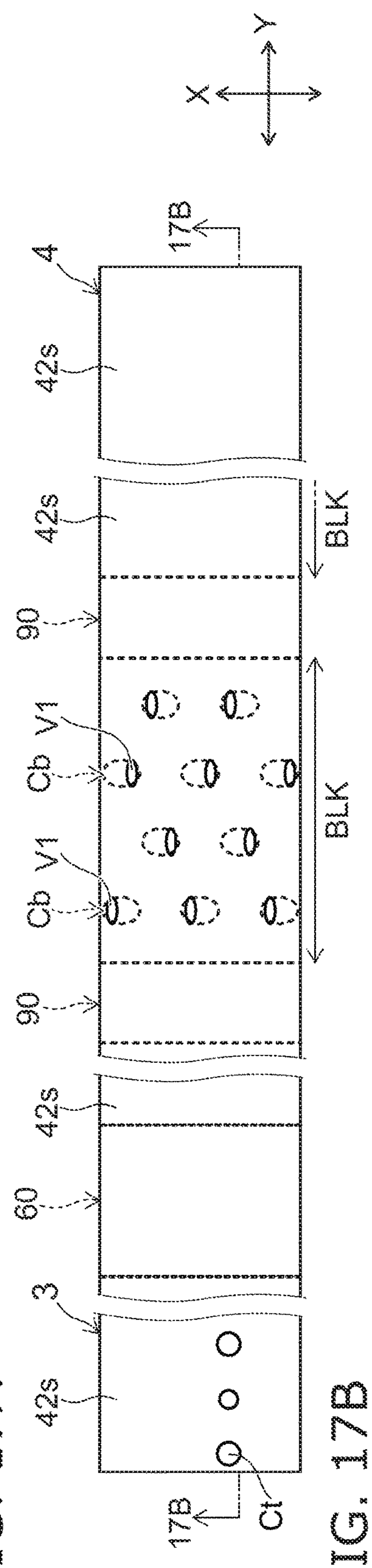
Figure 17B:
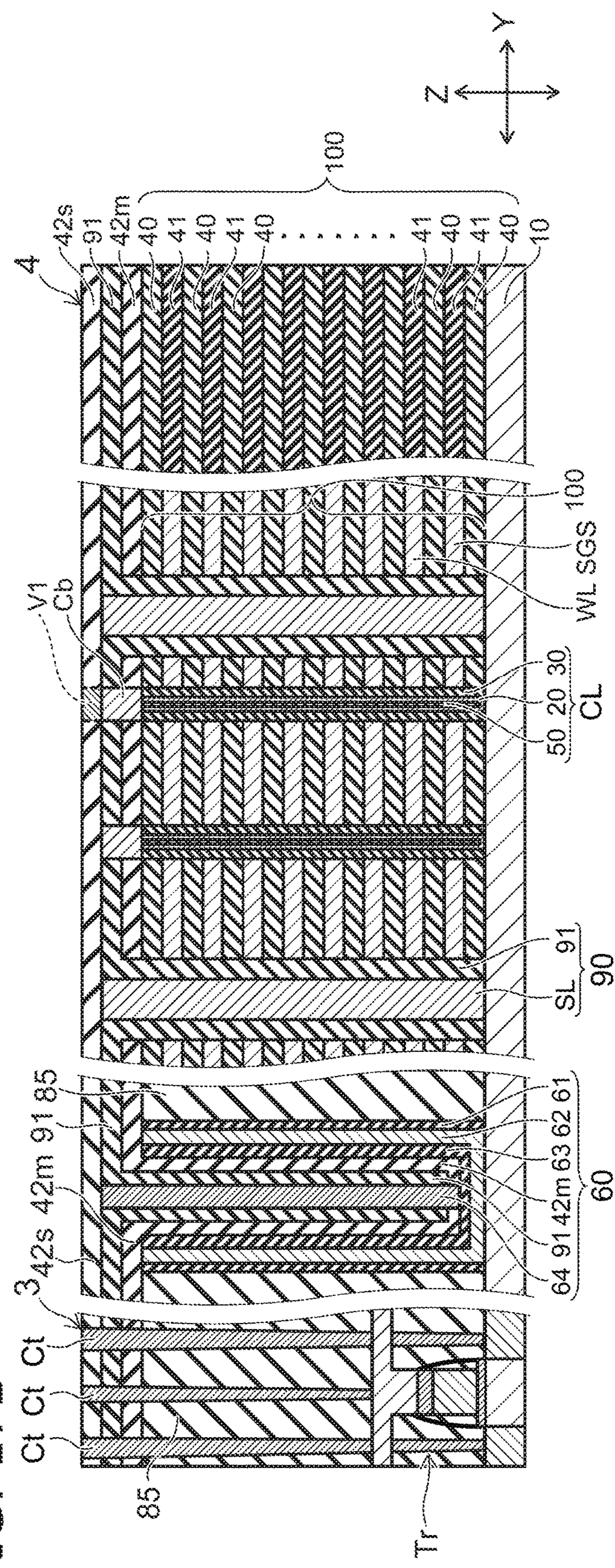

FIG. 15A to FIG. 17B are schematic views showing the method for manufacturing the semiconductor device of the third embodiment. FIG. 15A, FIG. 16A, and FIG. 17A are schematic plane views of the semiconductor device of the third embodiment. FIG. 15B, FIG. 16B, and FIG. 17B are schematic cross-sectional views shown a dashed line of each of the plane views described above.

<Forming the Transistor Tr and the Stacked Body 100>

As shown in FIG. 15A and FIG. 15B, the plurality of transistors Tr is formed on the substrate 10. After that, the stacked body 100 described with reference to FIG. 5A and FIG. 5B is formed on the substrate 10 and on the plurality of transistors Tr.

<Forming the Outer Peripheral Portion 4, and Forming the Insulating Portion 85>

Next, as shown in FIG. 16A and FIG. 16B, the stacked body 100 formed on the transistor Tr and on a region to form the wall portion 60 is removed. Further, the stacked body 100 is divided into a region where the memory cell array 1 is formed and a region of the outer peripheral portion 4. Thereby, the outer peripheral portion 4 surrounding the stacked body 100 and the transistor Tr is formed. After that, the insulating portion 85 is formed in a portion where the stacked body 100 is removed.

<Forming the Slit 60*s* to Forming the Wall Portion 60>

After that, by the similar process to a detail described with reference to FIG. 7A to FIG. 11B, each of structures is formed.

<Forming the Contact Portions Ct, Cb, the Via V1, and the Bit Line BL>

Next, as shown in FIG. 17A and FIG. 17B, the contact portion Cb and the via V1 are formed on the columnar portion CL, and the contact portion Ct is formed on the transistor Tr. Thereby, the peripheral circuit 3 is formed. Here, the contact portion Ct and the via V1 may be simultaneously formed. After that, the bit line BL shown in FIG.

3A and FIG. 3B is formed. The semiconductor device of the third embodiment may be, for example, manufactured by the method for manufacturing above described. Also in the third embodiment, when the thermal annealing is performed, the thermal stress generated in the stacked body 100 may be relaxed.

Fourth Embodiment: Semiconductor Device

Figures 18A, 18B:
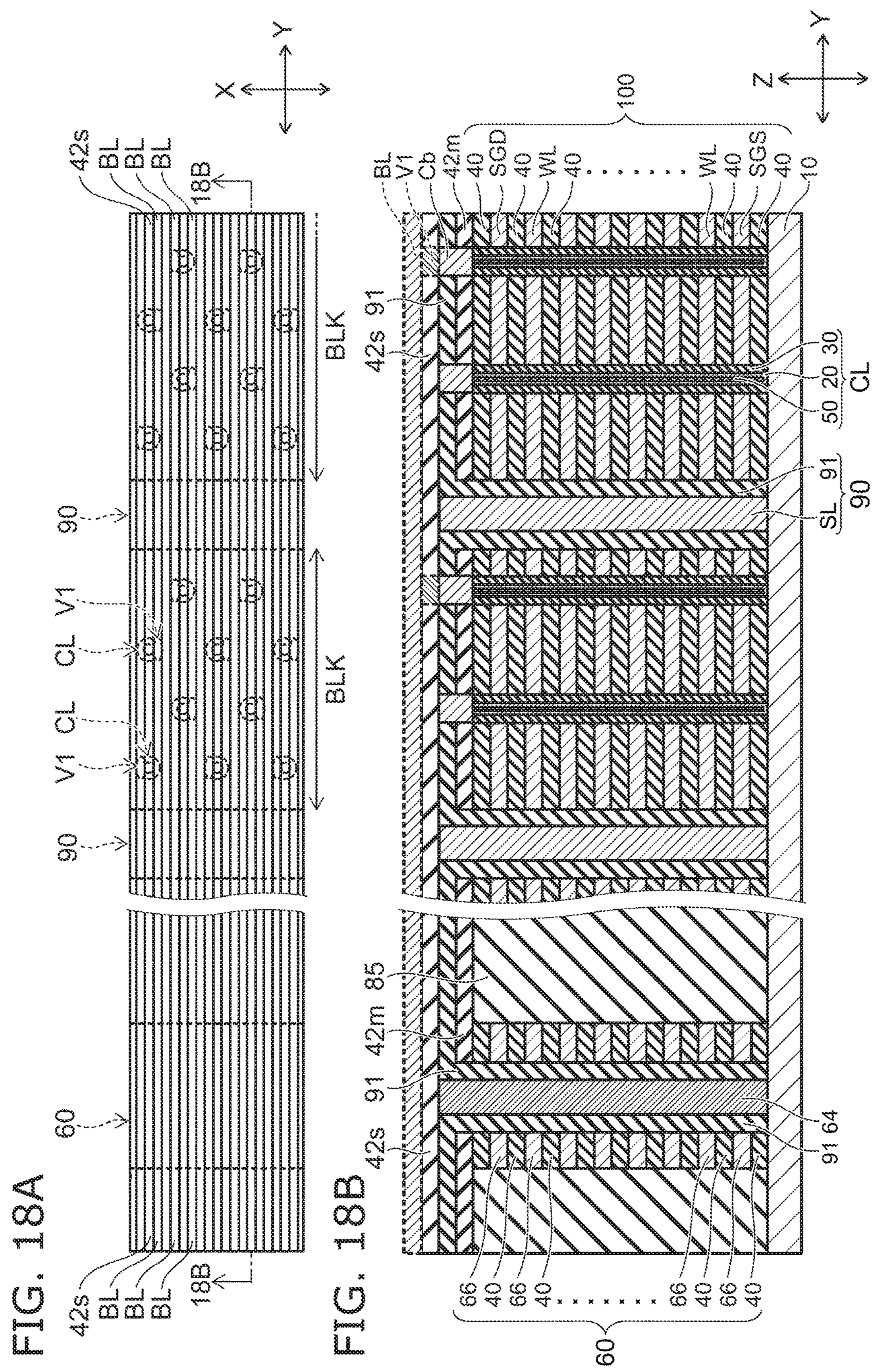
FIG. 18A is a schematic plane view of the semiconductor device of a fourth embodiment.
FIG. 18B is a schematic cross-sectional view along a 18B-18B line in FIG. 18A.

FIG. 18A is a schematic plane view of the semiconductor device of a fourth embodiment. The plane view shown in FIG. 18A corresponds to in a frame 18A in FIG. 14. FIG. 18B is a schematic cross-sectional view along a 18B-18B line in FIG. 18A. In FIG. 18B, the bit line BL and the via V1 provided at a back of a paper are shown by a broken line.

As shown in FIG. 18A and FIG. 18B, the semiconductor device of the fourth embodiment is different from the semiconductor device of the third embodiment in that the wall portion 60 includes the conductive layer 66 and the insulator 40. Here, the peripheral circuit 3 and the outer peripheral portion 4 are the same as those in the third embodiment, not shown.

In the wall portion 60, a plurality of conductive layers 66 is stacked with the insulator 40 interposed. The insulating layer 91 and the conductive film 64 extend in the Z-direction and in the X-direction, in the stacked body of the conductive layer 66 and the insulator 40. The conductive layer 66 includes a material same as a material of the electrode layer (SGS, WL, SGD).

Also in the fourth embodiment, the wall portion 60 is provided between the peripheral circuit 3 and the memory cell array 1. Thus, the thermal stress generated in the memory cell array 1 may be relaxed.

Fourth Embodiment: Manufacturing Method

Next, one example of a method for manufacturing the semiconductor device of the fourth embodiment will be described.

FIG. 19A to FIG. 23B are schematic views showing the method for manufacturing the semiconductor device of the fourth embodiment. FIG. 19A, FIG. 20A, FIG. 21A, FIG. 22A, and FIG. 23A are schematic plane views of the semiconductor device of the fourth embodiment. FIG. 19B, FIG. 20B, FIG. 21B, FIG. 22B, and FIG. 23B are schematic cross-sectional views shown a dashed line of each of the plane views described above.

<Forming the Transistor Tr to Forming the Insulating Portion 85, and Forming the Wall Portion 60>

Figure 19A:
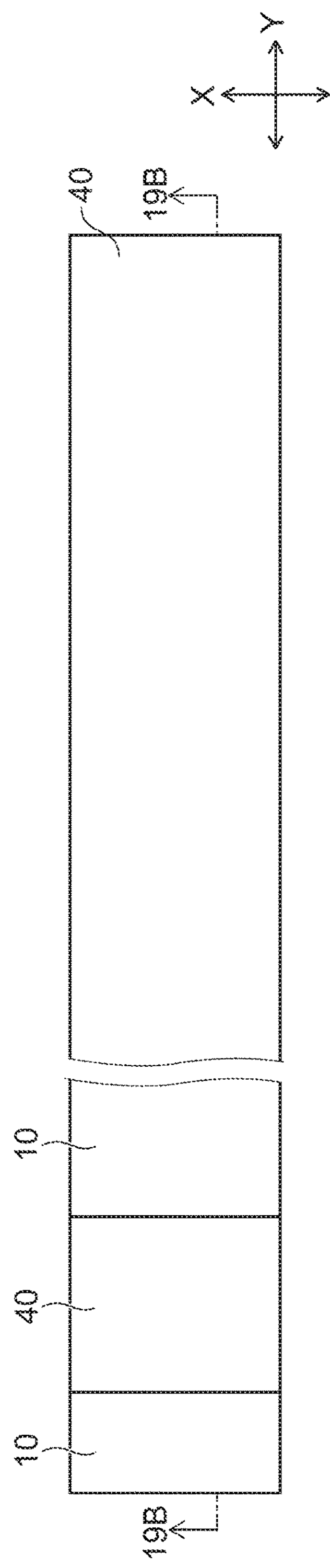
FIG. 19A to FIG. 23B are schematic views showing a method for manufacturing the semiconductor device of the fourth embodiment.
Figure 19B:
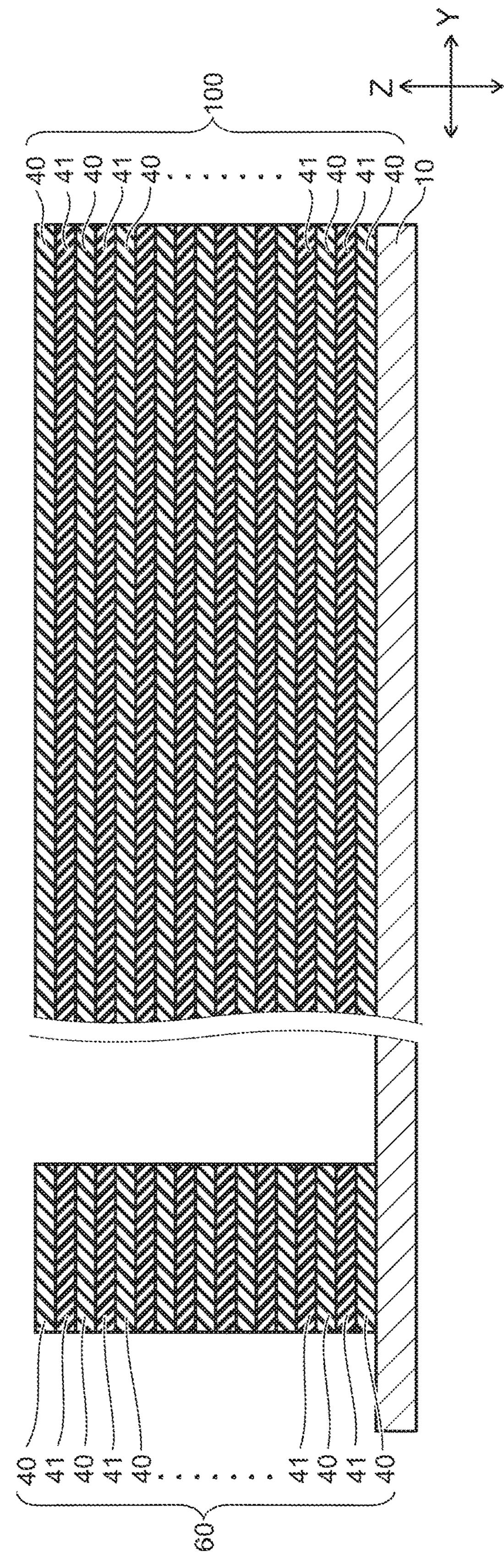
Figure 20A:
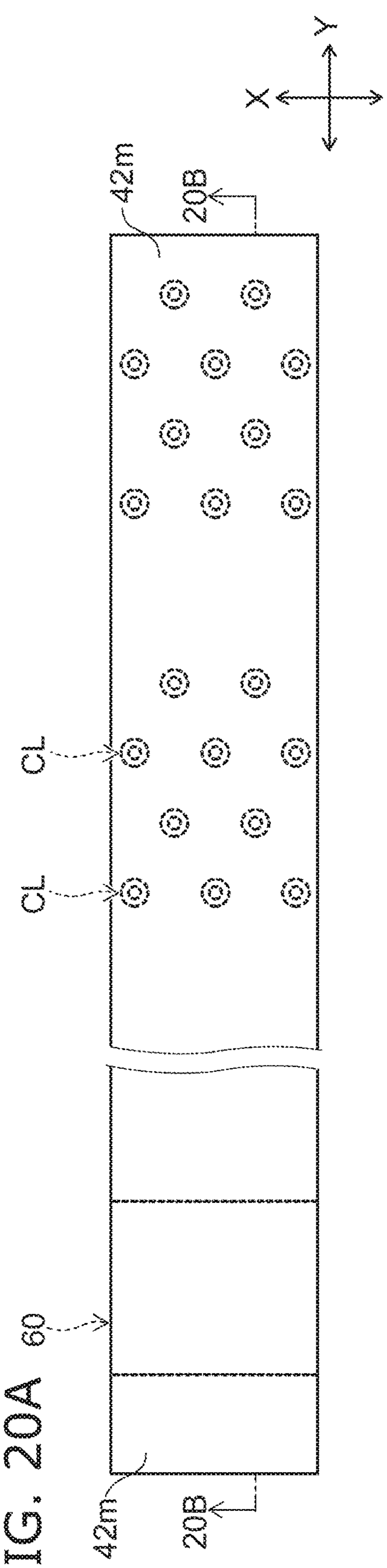
Figure 20B:
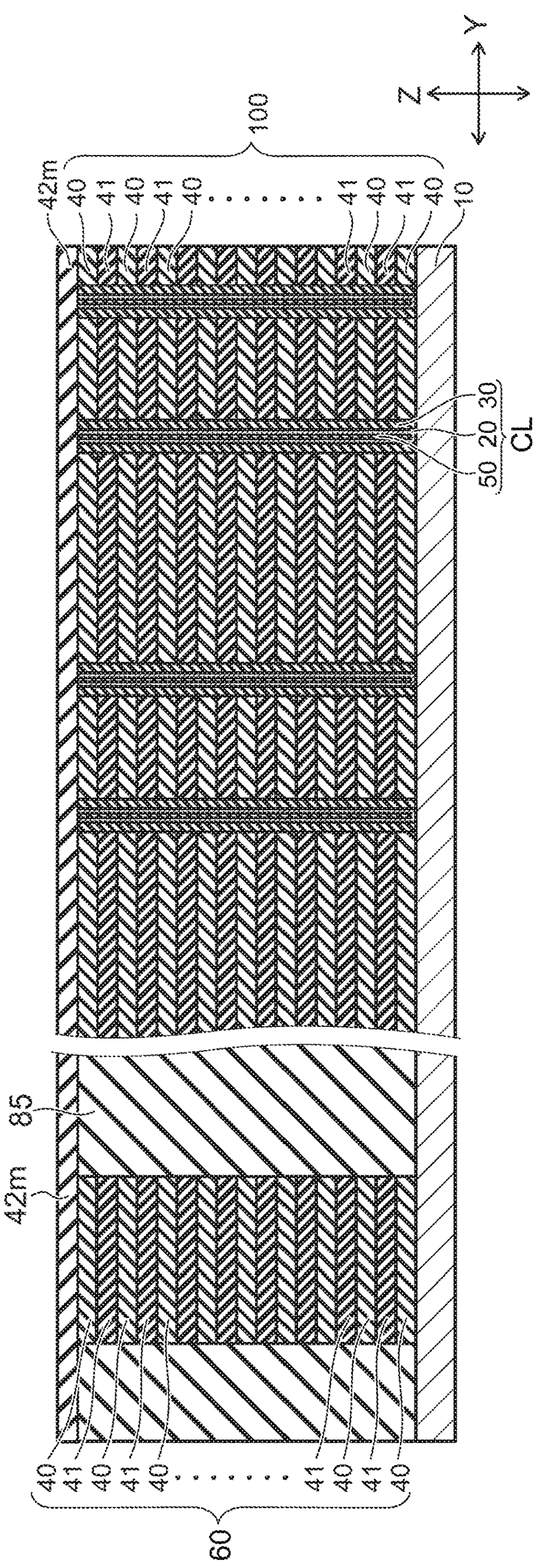

For example, according to the method for manufacturing described with reference to FIG. 15A to FIG. 16B, the plurality of transistors Tr, the stacked body 100, and the outer peripheral portion 4 are formed. Next, as shown in FIG. 19A and FIG. 19B, a portion of the stacked body 100 is removed to leave a region to be the wall portion 60. This removing process is performed by photolithography and etching used RIE method and so on. Furthermore, as shown in FIG. 20A and FIG. 20B, by covering the wall portion 60 with an insulating film using CVD method and so on, and by flattening an upper portion of the wall portion 60 and an upper portion of the insulating film, the insulating portion 85 is formed. Namely, the wall portion 60 is formed outside of the stacked body 100 via the insulating portion 85.

<Forming the Columnar Portion CL>

After that, the columnar portion CL is formed in the stacked body 100. As a method forming the columnar portion CL, the hole MH shown in FIG. 7A and FIG. 7B is formed in the stacked body 100, and the memory film 30, the semiconductor body 20, and the core layer 50 is sequentially formed in the hole MH.

After that, by performing thermal annealing, the columnar portion CL is formed. At this time, also in the fourth embodiment, the thermal stress generated in the stacked body 100 may be relaxed. After that, the insulator 42*m* is formed on the stacked body 100, the wall portion 60, and the insulating portion 85.

<Forming the Electrode Layer (SGS, WL, SGD)>

Figure 21A:
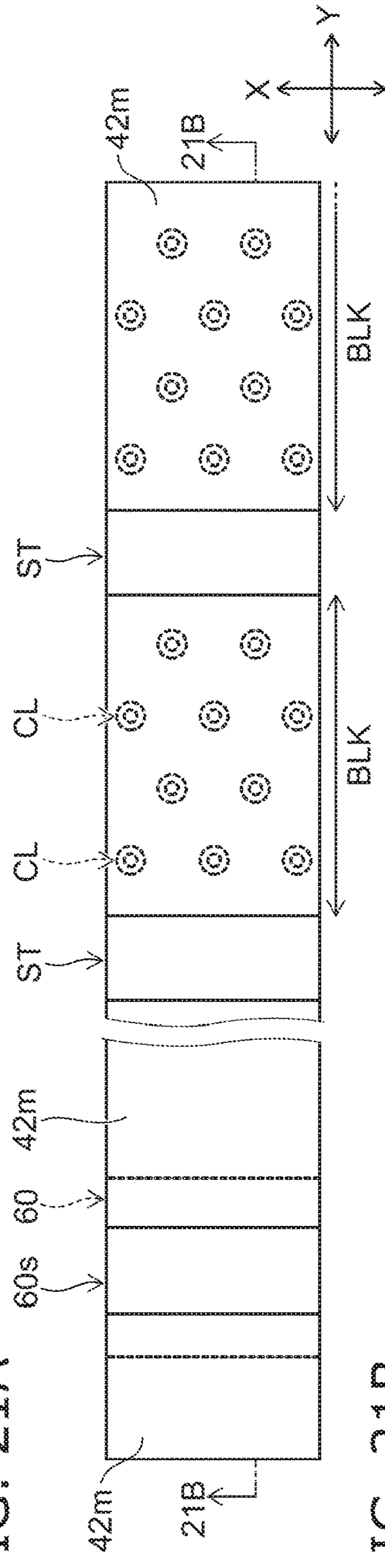
Figure 21B:
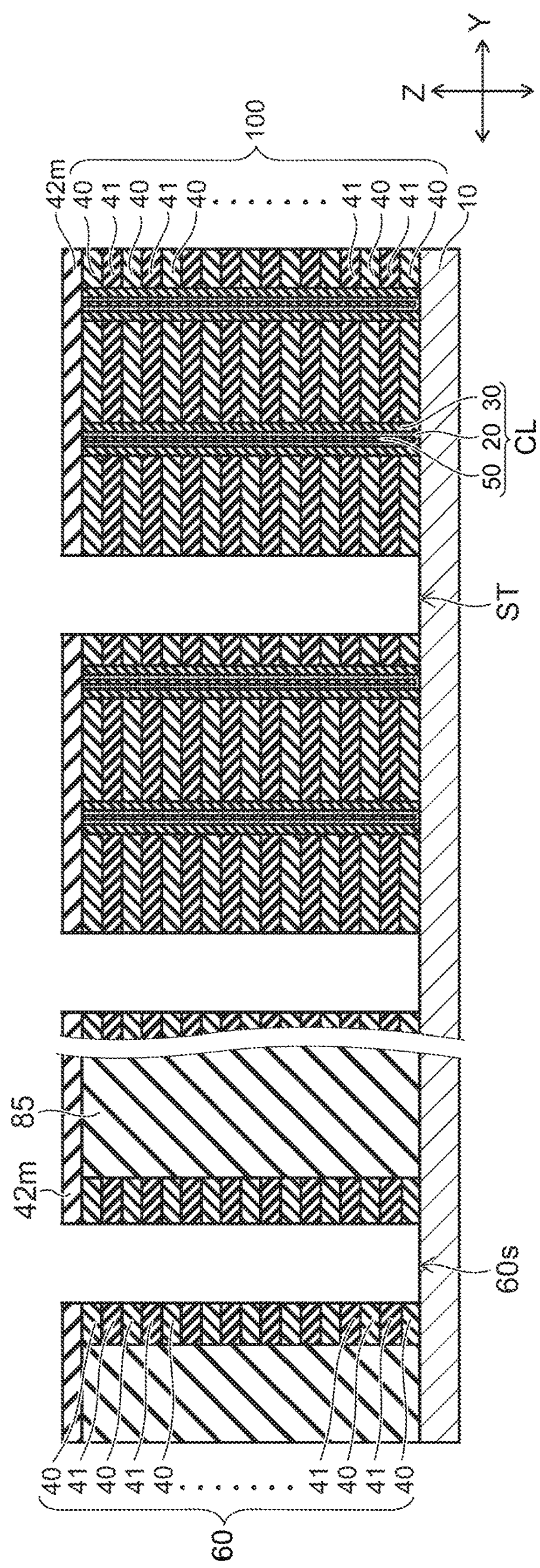

Next, as shown in FIG. 21A and FIG. 21B, the slit ST is formed in the stacked body 100, and the slit 60*s* is formed in the wall portion 60. The slit 60*s* pierces the insulator 42*m* and the wall portion 60, and reaches the substrate 10. The slit 60*s* extends in the X-direction.

Figure 22A:
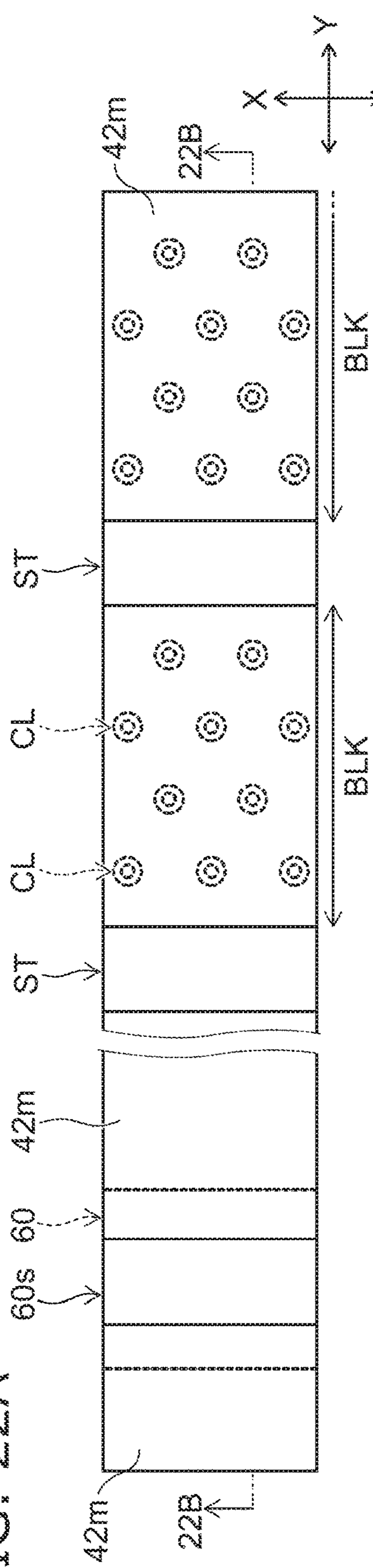
Figure 22B:
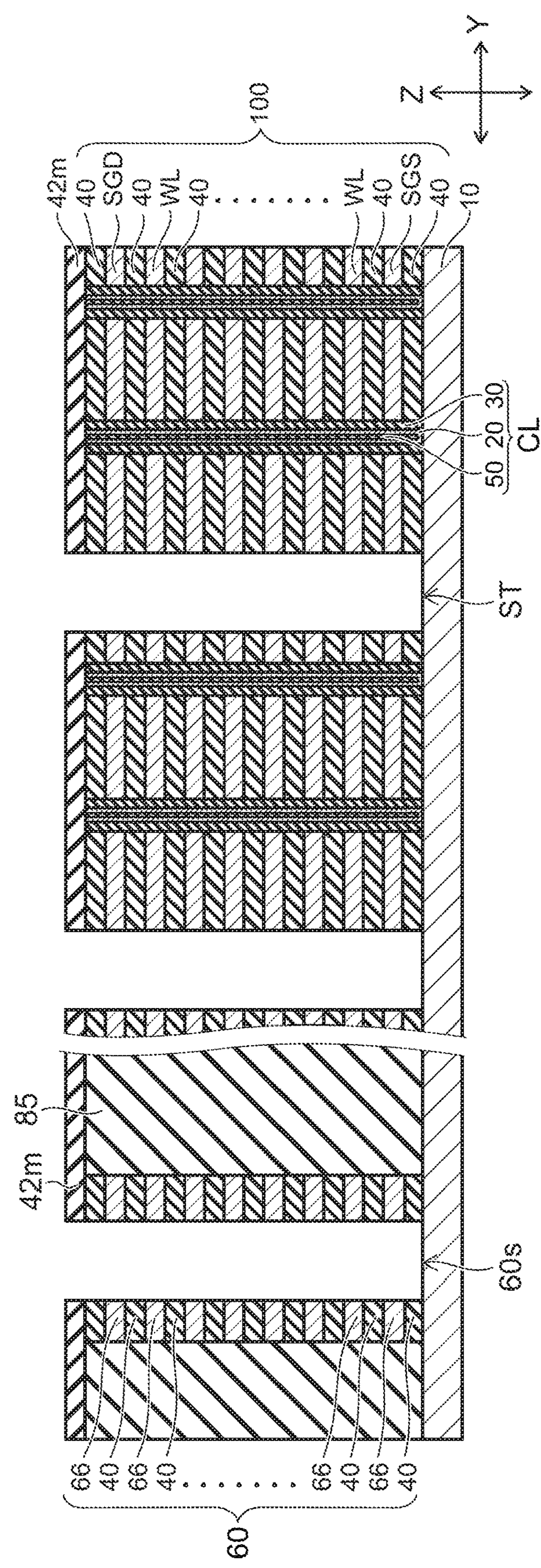

Next, as shown in FIG. 22A and FIG. 22B, the replacement member 41 is removed from the stacked body 100 and the wall portion 60, via the slit ST and the slit 60*s*. After that, the blocking insulating film 35 (FIG. 22B and FIG. 23B omitted) shown in FIG. 4 and the electrode layer (SGS, WL, SGD) are formed in a portion of the stacked body 100 where the replacement member 41 is removed. Further, the conductive layer 66 is formed in the portion of the wall portion 60 where the replacement member 41 is removed. A material same as the blocking insulating film 35 and the electrode layer (SGS, WL, SGD) is selected as the conductive layer 66. Here, when the blocking insulating film 35 is formed, the thermal annealing may be performed. In this case, similar to the case of forming the columnar portion CL, the thermal stress generated in the stacked body 100 may be relaxed.

<Forming the Side Wall Portion 90>

Figure 23A:
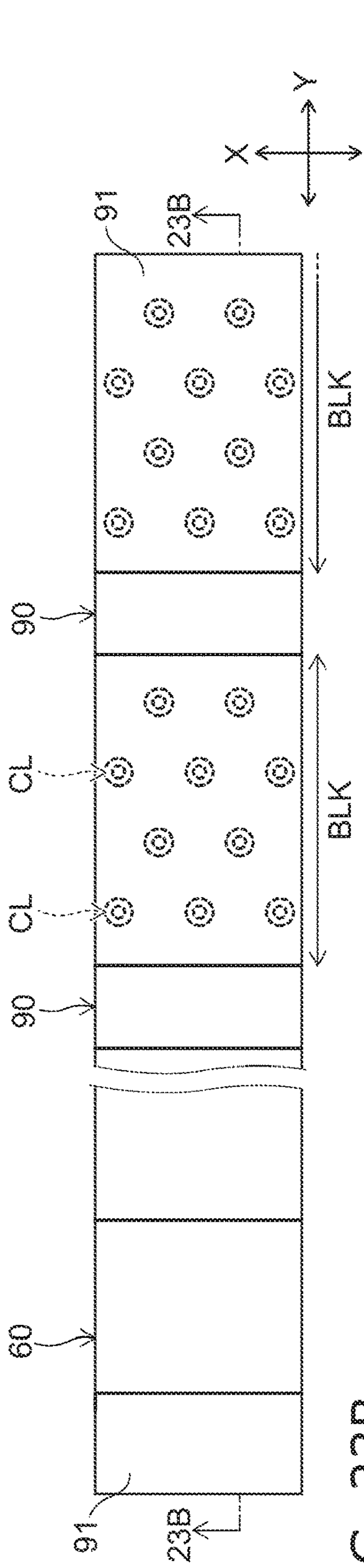
Figure 23B:
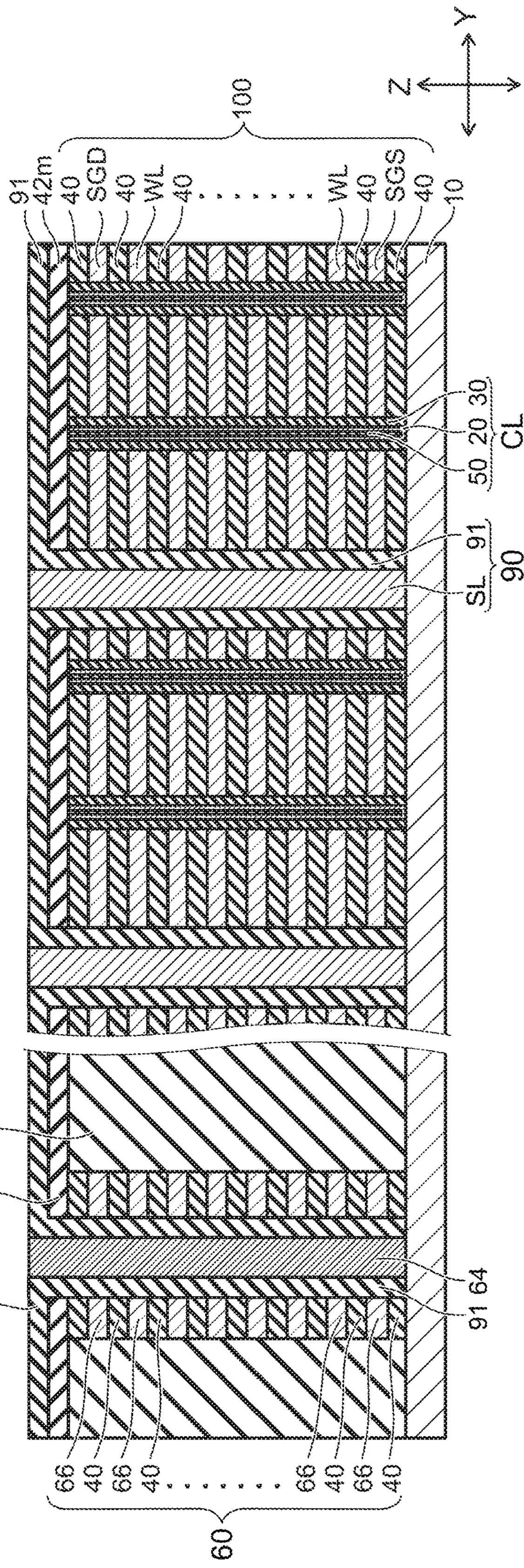

Next, as shown in FIG. 23A and FIG. 23B, the insulating layer 91 is formed on the each of side walls of the slits ST, 60*s* and the insulator 42*m*. After that, the source line SL is formed on the insulating layer 91, and the source line SL formed on each of the slits ST, 60*s* is, for example, removed by CMP method. Thereby, the side wall portion 90 is formed.

<Forming the Contact Portions Ct, Cb, the Via V1, and the Bit Line BL>

Next, as shown in FIG. 18A and FIG. 18B, the contact portion Cb and the via V1 are formed on the columnar portion CL, and the contact portion Ct is formed on the transistor Tr shown in FIG. 14B. After that, the bit lint BL is formed on the via V1 and the insulating portion 85. The semiconductor device of the fourth embodiment may be, for example, manufactured by the method for manufacturing above described. Here, the semiconductor device of the fourth embodiment may be, for example, formed in the layout shown in FIG. 1 and FIG. 13A.

Fifth Embodiment: Semiconductor Device

Figure 24A:
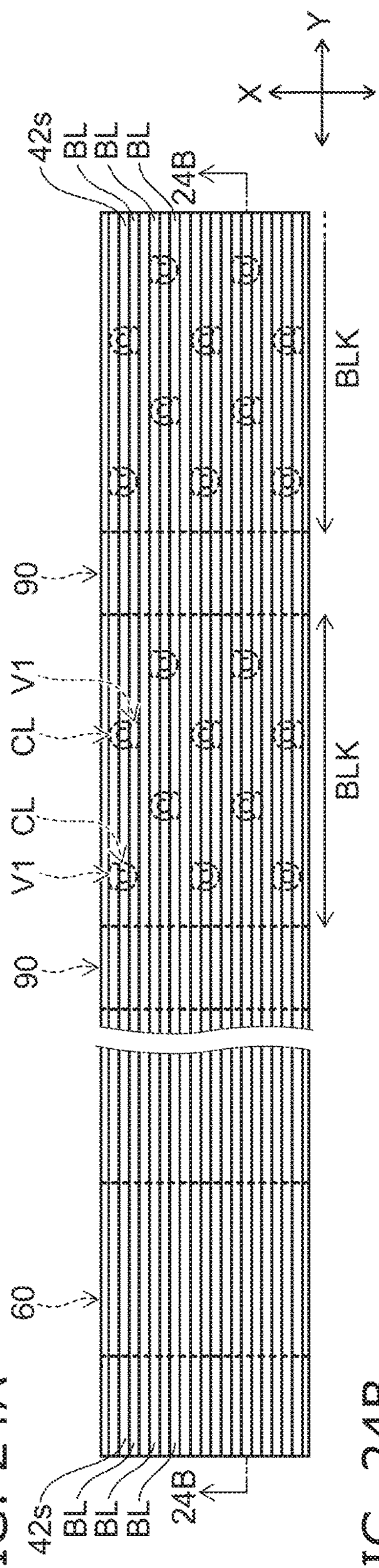
FIG. 24A is a schematic plane view of the semiconductor device of a fifth embodiment.
Figure 24B:
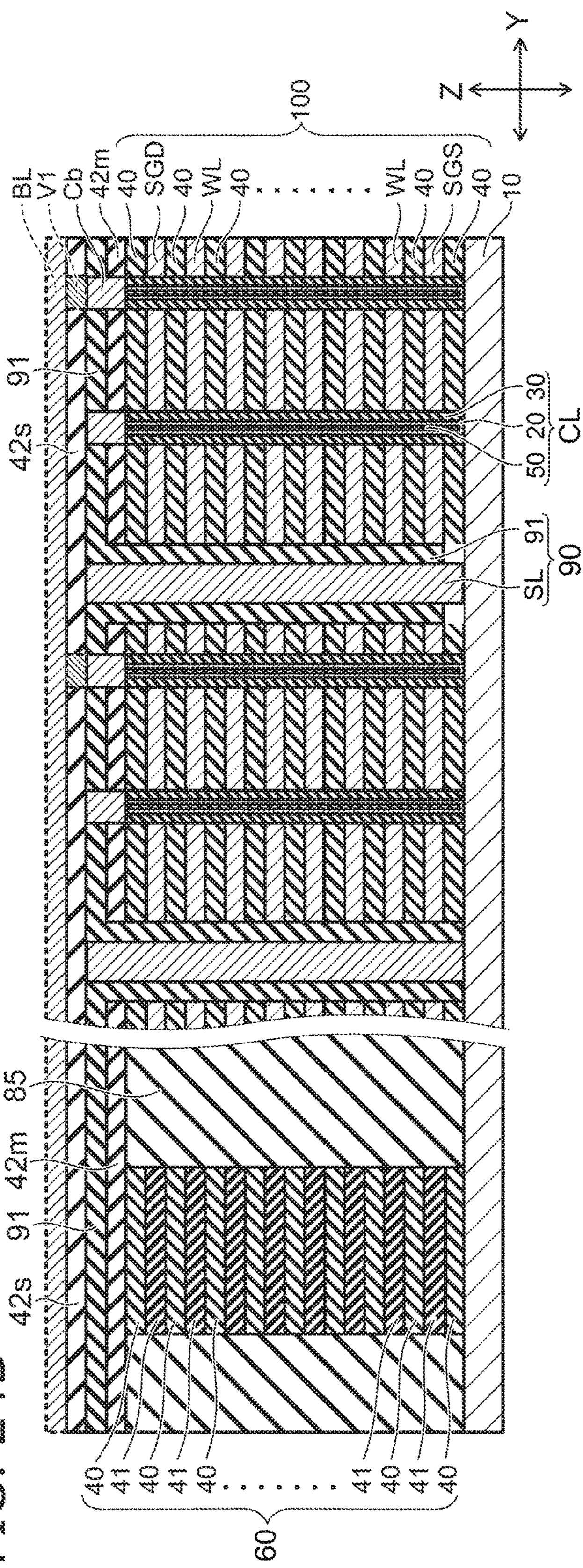
FIG. 24B is a schematic cross-sectional view along a 24B-24B line in FIG. 24A.

FIG. 24A is a schematic plane view of the semiconductor device of a fifth embodiment. The plane view shown in FIG. 24A corresponds to the plane view shown in FIG. 18A. FIG. 24B is a schematic cross-sectional view along a 24B-24B line in FIG. 24A. In FIG. 24B, the bit line BL and the via V1 provided at a back of a paper are shown by a broken line.

As shown in FIG. 24A and FIG. 24B, the semiconductor device of the fifth embodiment is different from the semiconductor device of the fourth embodiment in that the wall portion 60 includes the replacement member 41, and the wall portion 60 does not include the insulating layer 91 and the conductive film 64.

The plurality of replacement members 41 (insulating member) is stacked with the insulator 40 interposed in the wall portion 60. Also in the fifth embodiment, the thermal stress generated in the memory cell array 1 may be relaxed.

Fifth Embodiment: Manufacturing Method

Next, one example of a method for manufacturing the semiconductor device of the fifth embodiment will be described.

Figure 25A:
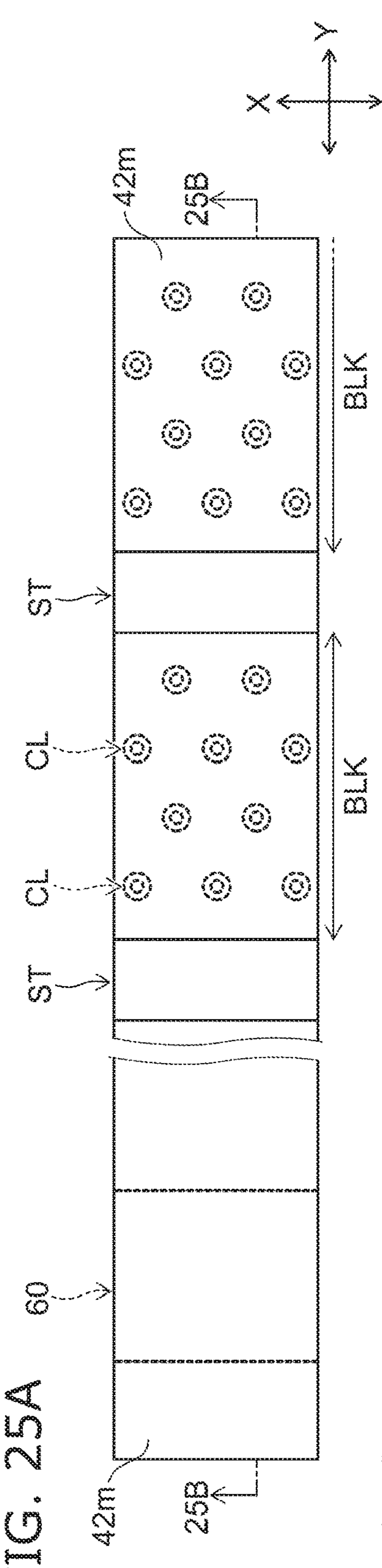
FIG. 25A to FIG. 27B are schematic views showing a method for manufacturing the semiconductor device of the fifth embodiment.
Figure 25B:
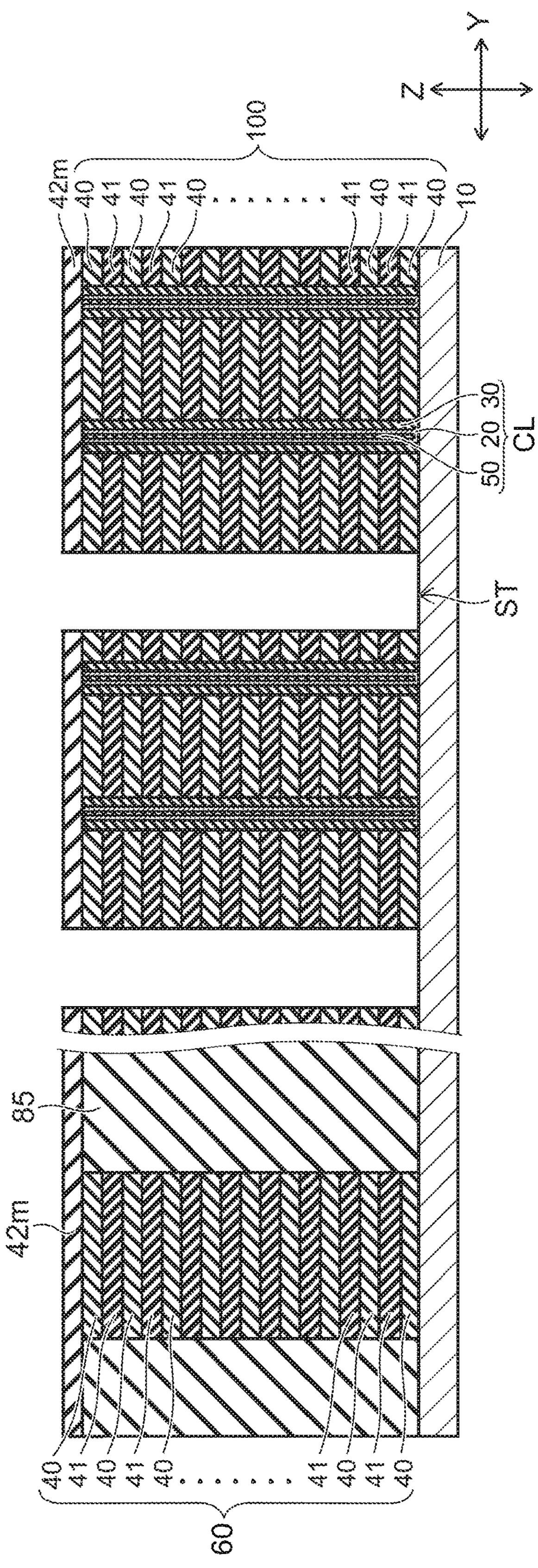
Figure 26A:
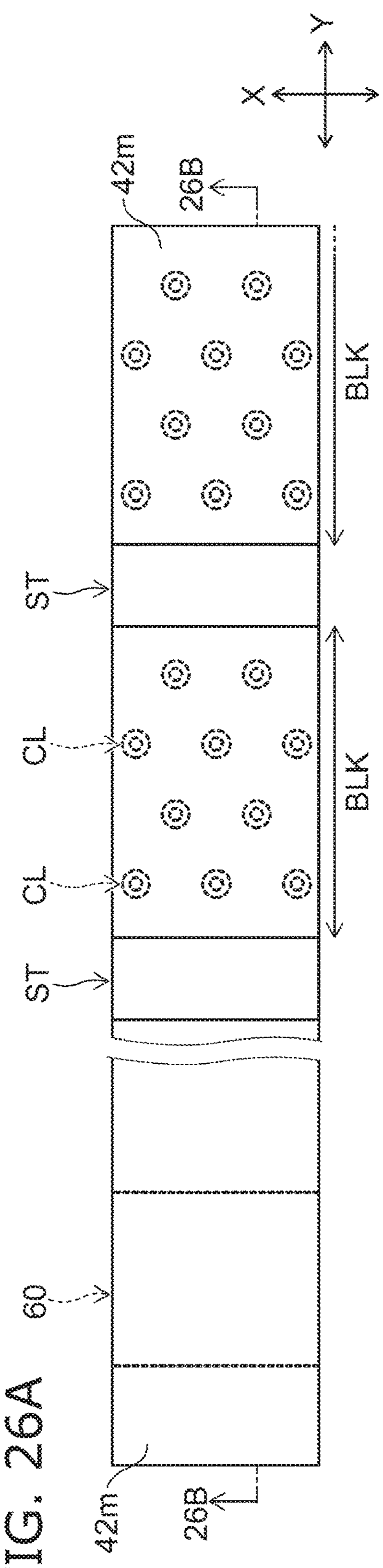
Figure 26B:
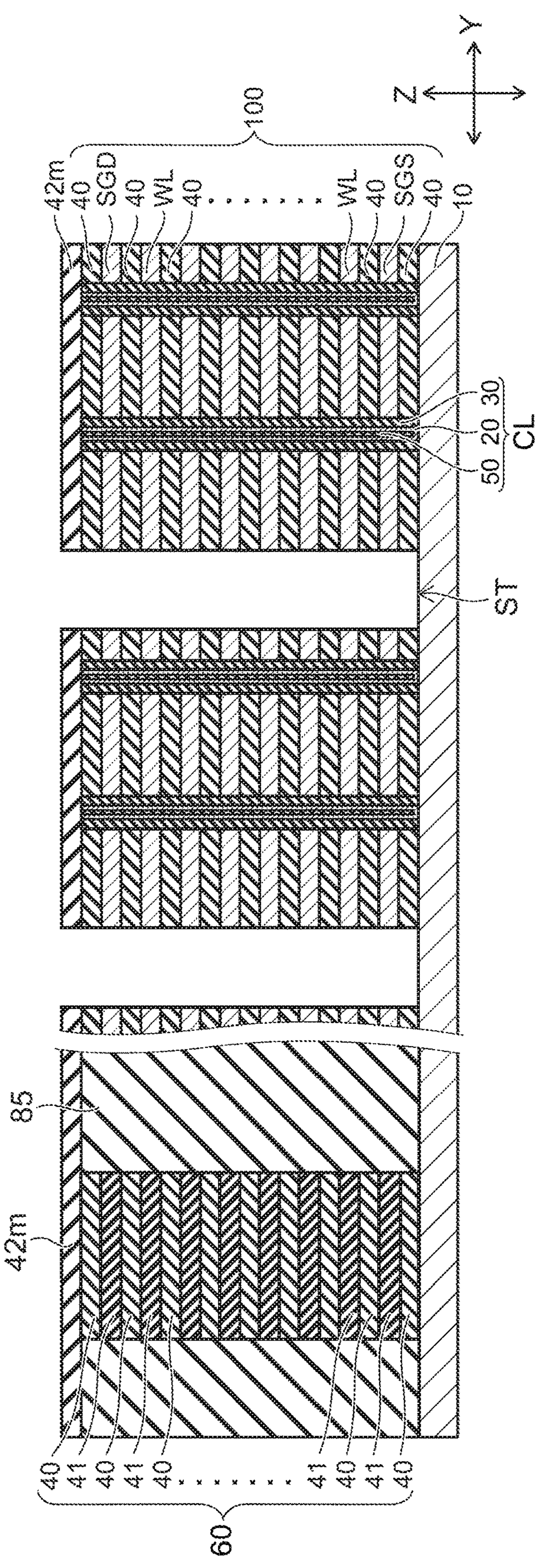
Figure 27A:
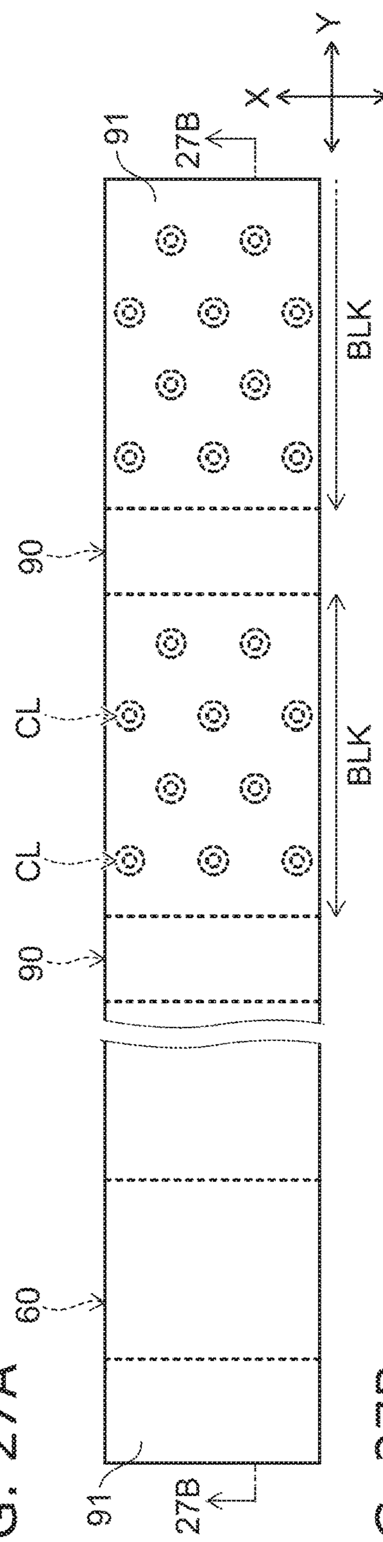
Figure 27B:
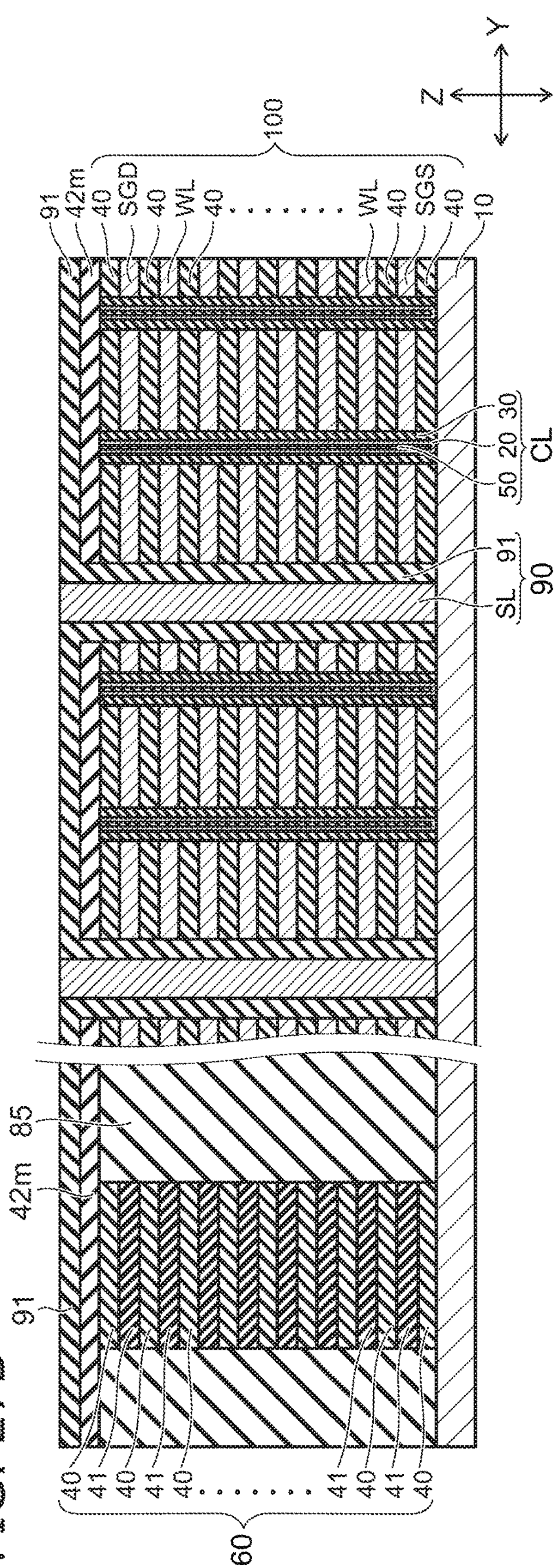

FIG. 25A to FIG. 27B are schematic views showing the method for manufacturing the semiconductor device of the fifth embodiment. FIG. 25A, FIG. 26A, and FIG. 27A are schematic plane views of the semiconductor device of the fifth embodiment. FIG. 25B, FIG. 26B, and FIG. 27B are schematic cross-sectional views shown a dashed line of each of the plane views described above.

<Forming the Transistor Tr to Forming the Insulating Portion 85, and Forming the Wall Portion 60>

For example, according to the method for manufacturing described with reference to FIG. 15A to FIG. 16B, the plurality of transistors Tr, the stacked body 100, and the outer peripheral portion 4 are formed. Next, according to the method for manufacturing described with reference to FIG. 19A to FIG. 20B, the wall portion 60 and the insulating portion 85 shown in FIG. 25A and FIG. 25B are formed.

<Forming the Columnar Portion CL>

After that, the columnar portion CL is formed in the stacked body 100. As a method forming the columnar portion CL, the hole MH shown in FIG. 7A and FIG. 7B is formed in the stacked body 100, and the memory film 30, the semiconductor body 20, and the core layer 50 is sequentially formed in the hole MH.

After that, by performing thermal annealing, the columnar portion CL is formed. At this time, also in the fifth embodiment, the thermal stress generated in the stacked body 100 may be relaxed.

<Forming the Electrode Layer (SGS, WL, SGD)>

After that, the insulator 42*m* is formed on the stacked body 100, the columnar portion CL, and the wall portion 60. Further, by forming the slit ST in the stacked body 100, the structure shown in FIG. 25A and FIG. 25B is obtained. At this time, the slit is not formed in the insulating portion 85 and the wall portion 60.

Next, as shown in FIG. 26A and FIG. 26B, the replacement member 41 is removed from the stacked body 100 via the slit ST. After that, the blocking insulating film 35 (FIG. 26B, FIG. 27B omitted) shown in FIG. 4 and the electrode layer (SGS, WL, SGD) are formed in a portion of the stacked body 100 where the replacement member 41 is removed. At this time, the replacement member 41 in the wall portion 60 is not removed. Here, when the blocking insulating film 35 is formed, the thermal annealing may be performed. In this case, similar to the case of forming the columnar portion CL, the thermal stress generated in the stacked body 100 may be relaxed.

<Forming the Side Wall Portion 90>

Next, as shown in FIG. 27A and FIG. 27B, the insulating layer 91 is formed on the side wall of the slit ST and the insulator 42*m*. After that, the source line SL is formed on the insulating layer 91, and the source line SL formed on the slit ST is, for example, removed by CMP method. Thereby, the side wall portion 90 is formed.

<Forming the Contact Portions Cb, Ct, the Via V1, and the Bit Line BL>

Next, as shown in FIG. 24A and FIG. 24B, the contact portion Cb and the via V1 are formed on the columnar portion CL, and the contact portion Ct is formed on the transistor Tr shown in FIG. 14B. After that, the bit lint BL is formed on the via V1 and the insulating portion 85. The semiconductor device of the fifth embodiment may be, for example, manufactured by the method for manufacturing above described. Here, the semiconductor device of the fifth embodiment may be, for example, formed in the layout shown in FIG. 1 and FIG. 13A.

Thus, according to the embodiment, the thermal stress generated in the stacked body 100 may be relaxed, and the inclining of the source line SL and the columnar portion CL may be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:

a stacked body including a plurality of electrode layers stacked with an insulator interposed;

a columnar portion provided in the stacked body and extending in a staking direction of the stacked body;

an insulating portion provided around the stacked body and surrounding the stacked body; and a wall portion provided in the insulating portion and separated from the stacked body, the wall portion extending in the stacking direction and in a first direction crossing the stacking direction, wherein a height of an upper surface of the wall portion is higher than a height of an upper surface of the columnar portion.

2. The semiconductor device according to claim 1, further comprising a side wall portion provided in the stacked body, the side wall portion extending in the stacking direction and the first direction, wherein the side wall portion includes a conductive layer electrically connected to the columnar portion.

3. The semiconductor device according to claim 2, further comprising a contact portion provided on the columnar portion and extending in the stacking direction, the contact portion in contact with the columnar portion and separated from the side wall portion.

4. The semiconductor device according to claim 2, wherein the wall portion includes a first wall portion and a second wall portion separated from each other, and the stacked body is provided between the first wall portion and the second wall portion.

5. The semiconductor device according to claim 4, wherein, along the first direction, a length of the first wall portion and a length of the second wall portion are longer than a length of the side wall portion.

6. The semiconductor device according to claim 1, further comprising:

a peripheral circuit covered with the insulating portion and separated from the stacked body; and an outer peripheral portion surrounding the stacked body, the insulating portion, the wall portion, and the peripheral circuit.

7. The semiconductor device according to claim 6, wherein, along a second direction crossing the stacking direction and the first direction, a distance between the stacked body and the wall portion is equal to a distance between the stacked body and the outer peripheral portion.

8. The semiconductor device according to claim 1, wherein the wall portion includes the plurality of electrode layers stacked with the insulator interposed.

9. A semiconductor device, comprising:

a stacked body including a plurality of electrode layers stacked with an insulator interposed;

a columnar portion provided in the stacked body and extending in a staking direction of the stacked body;

an insulating portion provided around the stacked body and surrounding the stacked body; and a wall portion provided in the insulating portion and separated from the stacked body, the wall portion extending in the stacking direction and in a first direction crossing the stacking direction, wherein the wall portion includes a plurality of insulating members stacked with the insulator interposed, and the plurality of insulating members includes a material different from the insulator.

10. The semiconductor device according to claim 1, wherein, a second direction crossing the stacking direction and the first direction, a maximum width of the wall portion is larger than a maximum diameter of the columnar portion, as viewed in the stacking direction.

11. The semiconductor device according to claim 1, wherein the columnar portion includes a semiconductor body extending the stacking direction, and a charge storage film provided between the semiconductor body and the stacked body.

12. A semiconductor device, comprising:

a stacked body including a plurality of electrode layers stacked with an insulator interposed;

a columnar portion provided in the stacked body and extending in a staking direction of the stacked body;

an insulating portion provided around the stacked body and surrounding the stacked body; and a wall portion provided in the insulating portion and separated from the stacked body, the wall portion extending in the stacking direction and in a first direction crossing the stacking direction, wherein the stacked body is surrounded with the wall portion.

13. A method for manufacturing a semiconductor device, comprising:

forming a stacked body including a plurality of first layers stacked with an insulator interposed;

forming an insulating portion around the stacked body;

forming a first slit in the insulating portion, the first slit extending in a stacking direction of the stacked body and in a first direction crossing the stacking direction;

forming a hole in the stacked body;

forming a first insulating film on a side wall of the hole, the first insulating film including a charge storage film;

forming a semiconductor body on the first insulating film; and annealing the semiconductor body.

14. The method for manufacturing the semiconductor device according to claim 13, wherein the forming the first slit includes forming the first slit to surround the stacked body.

15. The method for manufacturing the semiconductor device according to claim 13, further comprising:

forming a second slit in the stacked body, the second stacked body extending the stacking direction and the first direction;

forming an insulating layer on a side wall of the second slit; and forming a conductive layer on the insulating layer.

16. The method for manufacturing the semiconductor device according to claim 15, further comprising:

after the forming the second slit, removing the plurality of first layers via the second slit, forming a plurality of second insulating films in a portion formed to remove the plurality of first layers;

forming a plurality of conductive layers on the plurality of second insulating films; and annealing the second insulating films.

17. The method for manufacturing the semiconductor device according to claim 15, wherein, along the first direction, a length of the first slit is not less than a length of the second slit.

18. The method for manufacturing the semiconductor device according to claim 13, further comprising:

before the forming the stacked body, forming a peripheral circuit; and after the forming the stacked body, forming an outer peripheral portion to divide the stacked body, wherein the forming the first slit includes forming the first slit between the peripheral circuit and the stacked body, and the outer peripheral portion surrounds the stacked body, the peripheral circuit, and the first slit.

19. A method for manufacturing a semiconductor device, comprising:

forming a stacked body including a plurality of first layers stacked with an insulator interposed;

forming a wall portion to divide a portion of the stacked body, the wall portion extending in a first direction crossing a stacking direction of the stacked body;

forming an insulating portion between the stacked body and the wall portion;

forming a hole in the stacked body;

forming an insulating film on a side wall of the hole, the insulating film including a charge storage film;

forming a semiconductor body on the insulating film; and annealing the semiconductor body.

* * * * *